(12) United States Patent
Ishiyama

(10) Patent No.: US 8,027,161 B2
(45) Date of Patent: Sep. 27, 2011

(54) ELECTRONIC POWER CONVERTER AND MOUNTING STRUCTURE OF SEMICONDUCTOR DEVICE

(75) Inventor: Hiroshi Ishiyama, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/457,246

(22) Filed: Jun. 4, 2009

(65) Prior Publication Data

US 2009/0251859 A1 Oct. 8, 2009

Related U.S. Application Data

(62) Division of application No. 12/073,871, filed on Mar. 11, 2008, now Pat. No. 7,724,523, which is a division of application No. 10/554,998, filed as application No. PCT/JP2004/011970 on Aug. 20, 2004, now Pat. No. 7,508,668.

(30) Foreign Application Priority Data

Aug. 21, 2003 (JP) ................................. 2003-297833
Aug. 22, 2003 (JP) ................................. 2003-299248

(51) Int. Cl.
*H05K 7/20* (2006.01)
*H01L 23/06* (2006.01)

(52) U.S. Cl. ......... 361/699; 361/689; 361/715; 361/716

(58) Field of Classification Search .................. 361/689, 361/699, 715, 716
See application file for complete search history.

(56) References Cited

U.S. PATENT DOCUMENTS

| | | | |
|---|---|---|---|
| 4,538,170 A | 8/1985 | Yerman | |
| 4,646,129 A | 2/1987 | Yerman et al. | |
| 4,827,082 A | 5/1989 | Horiuchi et al. | |
| 5,031,069 A * | 7/1991 | Anderson | 361/321.1 |
| 5,579,217 A * | 11/1996 | Deam et al. | 363/144 |
| 5,864,177 A | 1/1999 | Sundstrom | |
| 6,046,921 A * | 4/2000 | Tracewell et al. | 363/141 |
| 6,072,240 A | 6/2000 | Kimura et al. | |
| 6,188,575 B1 | 2/2001 | Azotea | |
| 6,292,368 B1 | 9/2001 | Pradel | |
| 6,345,507 B1 * | 2/2002 | Gillen | 62/3.7 |
| 6,434,006 B1 | 8/2002 | Fukatsu et al. | |
| 6,499,306 B2 | 12/2002 | Gillen | |
| 6,542,365 B2 | 4/2003 | Inoue | |
| 6,621,701 B2 | 9/2003 | Tamba et al. | |
| 6,661,659 B2 | 12/2003 | Tamba et al. | |
| 6,693,348 B2 | 2/2004 | Nakajima | |
| 6,703,707 B1 | 3/2004 | Mamitsu et al. | |
| 6,704,202 B1 | 3/2004 | Hamaoka et al. | |
| 6,845,012 B2 | 1/2005 | Ohkouchi | |
| 6,888,729 B2 | 5/2005 | Maekawa et al. | |

(Continued)

FOREIGN PATENT DOCUMENTS

EP 1 000 796 A2 5/2000

(Continued)

*Primary Examiner* — Anatoly Vortman
(74) *Attorney, Agent, or Firm* — Oliff & Berridge PLC

(57) ABSTRACT

An electric power converter has a main circuit section including a semiconductor module and a cooling device; a control circuit substrate section electrically connected to a signal terminal of the semiconductor module, and having a control circuit; and a power wiring section connected to a main electrode terminal of the semiconductor module. The main circuit section is interposed between the control circuit substrate section and the power wiring section.

2 Claims, 19 Drawing Sheets

U.S. PATENT DOCUMENTS

| | | |
|---|---|---|
| 6,960,825 B2 | 11/2005 | Mamitsu et al. |
| 7,027,302 B2 | 4/2006 | Inoue |
| 7,106,592 B2 | 9/2006 | Inoue et al. |
| 7,113,400 B2 | 9/2006 | Nagata et al. |
| 7,208,829 B2 | 4/2007 | Hauenstein et al. |
| 7,456,492 B2 | 11/2008 | Mochida |
| 2002/0038550 A1 | 4/2002 | Gillen |
| 2003/0132041 A1 | 7/2003 | Beihoff et al. |
| 2003/0133259 A1 | 7/2003 | Meyer et al. |
| 2003/0133267 A1 | 7/2003 | Beihoff et al. |
| 2003/0133282 A1 | 7/2003 | Beihoff et al. |

FOREIGN PATENT DOCUMENTS

| | | | |
|---|---|---|---|
| JP | A-07-308070 | | 11/1995 |
| JP | A-09-312376 | | 12/1997 |
| JP | A-10-056131 | | 2/1998 |
| JP | A-11-069774 | | 3/1999 |
| JP | A-2001-320005 | | 11/2001 |
| JP | A-2002-325467 | | 11/2002 |
| JP | A-2003-116282 | | 4/2003 |
| JP | A-2003-125588 | | 4/2003 |
| JP | 2003258466 A | * | 9/2003 |
| JP | A-2003-298009 | | 10/2003 |

* cited by examiner

ELECTRONIC POWER CONVERTER AND MOUNTING STRUCTURE OF SEMICONDUCTOR DEVICE

This is a Divisional of application Ser. No. 12/073,871 filed Mar. 11, 2008, now U.S. Pat. No. 7,724,523 which is a Divisional of application Ser. No. 10/554,998 filed Nov. 1, 2005 that issued as U.S. Pat. No. 7,508,668, which is a National Phase of Application No. PCT/JP2004/011970 filed Aug. 20, 2004. The disclosures of the prior applications are hereby incorporated by reference herein in their entirety.

FIELD OF THE INVENTION

The present invention relates to an electric power converter such as an inverter device using a semiconductor module, and the mounting structure of a semiconductor device suitably used with the semiconductor device used as the inverter device.

BACKGROUND ART

For example, an inverter of large capacity for performing bidirectional conversion between direct current electric power and alternating current electric power is required in a hybrid automotive vehicle having both an internal combustion engine and an electric motor as a driving source, an automotive vehicle having an electric motor as a driving source, and the like. Therefore, electric power converters including this inverter have been variously developed.

An inverter circuit (i.e., an electric power converting circuit) is constructed by using a semiconductor module including an IGBT element, and the like, therein. However, since the inverter circuit has large capacity, as mentioned above, a large amount of heat is generated. Therefore, as shown in FIG. 6, the conventional electric power converter 9 is constructed by assembling a cooling device 91 for cooling the above semiconductor module 92.

More concretely, the semiconductor module 92 is arranged so as to face the cooling device 91. A power wiring section 93 for supplying an electric current of a bus bar, etc. to the semiconductor module 92 and stopping the supply of the electric current is arranged so as to face the semiconductor module 92. Further, the electric power converter 9 is constructed by arranging a control circuit substrate section 95 through a shield layer 94. The control circuit substrate section 95 controls the operation of the semiconductor module 92. However, it is indispensable that the above shield layer 94 is interposed and arranged to avoid the influence of noises from the above power wiring section 93. For example, the structure of such an electric power converter is shown in JP-A-H11-69774.

However, there are the following problems in the conventional electric power converter 9. Namely, it is indispensable in the above conventional electric power converter 9 that the above shield layer 94 is interposed and arranged to raise the operating performance of the control circuit substrate section 95. Therefore, the number of parts required is increased and it is difficult to reduce costs.

Further, the influence of noises from the power wiring section 93 to the control circuit substrate section 95 can be reduced by the above shield layer 94. However, a connecting line 955 for connecting the control circuit substrate section 95 and the semiconductor module 92 still penetrates portions of the shield layer 94 and the power wiring section 93. Therefore, it is difficult to remove the influence of the noises on the above control circuit substrate section 95.

Further, for example, in the electric automotive vehicle and the hybrid automotive vehicle, as shown in FIG. 25, the direct current of a battery 1500 is converted into an alternating current by an inverter device 1510, and an alternating current generator 1505 is operated. The inverter device 1510 includes plural semiconductor modules.

As is well known, each semiconductor module has an internal semiconductor element (switch element) 1511, a pair of electrodes on both sides of the semiconductor element 1511, and a signal terminal connected to an external control circuit. The semiconductor element 1511 is switched by a control signal inputted from the control circuit 1512 through the signal terminal, and an artificial alternating current is generated.

During operation of the semiconductor module, noises of high frequencies are generated in its electrically conductive portion and are emitted from direct current power lines 1514, 1515 and an alternating current power line 1516. To prevent this, high frequency capacitors 1521, 1522 and 1523 are connected between the direct current power lines 1514, 1515 and the ground and between the alternating current power line 1516 and the ground through a lead wire 1526 so that a noise component is bypassed.

On the other hand, a conventional self-excited type rectifying circuit (see JP-A-07-308070) shown in FIG. 26 includes self-excited type rectifying circuit portions 1532 and 1535 for converting an alternating current supplied from a commercial electric power source 1530 into a predetermined and desirable direct current voltage. Noises generated by a switching operation of a rectifying element 1536 constituting the rectifying circuit portion 1535 are introduced into the commercial electric power source 1530 and have a bad influence on the commercial electric power source.

To prevent this, a noise restraining circuit 1540 is arranged between the self-excited type rectifying circuit portions 1532 and 1535. The noise restraining circuit 1540 includes a noise restraining reactor 1542 arranged in each phase line 1541, a capacitor 1544 arranged between the respective phase lines 1541, and a capacitor 1546 arranged between one phase line and the ground. The noise restraining reactor 1542 and the capacitor 1544 restrain the emission of a normal-mode noise, and the capacitor 1546 restrains the emission of a common-mode noise.

The above inverter device 1510 of the electric automotive vehicle, etc. has the following problems. The lead wire 1526 for connecting the high frequency capacitors 1521 to 1523 to the electric power lines 1514 to 1516 has a large resistance component and a large inductance component. It is necessary to increase the capacities of the high frequency capacitors 1521 to 1523 to obtain a sufficient noise restraining effect by reducing the impedance of a bypass path. Thus, a high frequency electric current transmitted via the high frequency capacitors 1521 to 1523 becomes a leaked electric current, and this leaked electric current creates an error in the operation of the inverter device 1510.

Further, since the semiconductor module is a noise generating source and the high frequency capacitors 1521 to 1523 for bypassing noises are separated from each other, the noises are inevitably emitted to a certain extent from the electric power lines 1514 to 1516 between the semiconductor module and the high frequency capacitors 1521 to 1523.

On the other hand, with respect to the above self-excited type rectifying circuit, only the arrangement of the reactor 1542 with respect to each phase line 1541, and the capacitor 1544 between the respective phase lines 1541, etc. are shown. No concrete mounting method of the capacitors 1544, 1546 is shown. In any case, if the capacitors 1544, 1546 are poorly arranged, cost and a space are correspondingly increased. Further, a resistance component, etc. exists in the lead wire for connecting the capacitors 1544, 1546 to the phase line 1541. Further, the capacitors 1544, 1546 are separated from the rectifying circuit portion 1535 so that noises are easily emitted from the phase line 1541 between the capacitors 1544, 1546 and the rectifying circuit portion 1535.

The present invention is made in consideration of such conventional problems, and a first object of the present invention is to provide an electric power converter capable of reducing the number of parts and restraining the influence of noises from the power wiring section. A second object of the present invention is to provide the mounting structure of a semiconductor device capable of effectively restraining the emission of noises generated in the semiconductor element without externally attaching a special bypass capacitor.

DISCLOSURE OF THE INVENTION

To achieve the above first object, an electric power converter in the present invention comprises: a main circuit section including a semiconductor module constituting one portion of an electric power converting circuit and a cooling device for cooling the semiconductor module; a control circuit substrate section electrically connected to a signal terminal of said semiconductor module and having a control circuit for controlling the operation of said semiconductor module; and a power wiring section connected to a main electrode terminal of said semiconductor that supplies an electric current to said semiconductor module and stops the supply of the electric current; wherein said main circuit section is interposed between said control circuit substrate section and said power wiring section.

As mentioned above, the electric power converter of the present invention is arranged such that the main circuit section, constructed by the semiconductor module and its cooling device, is nipped and supported by the above control circuit substrate section and the power wiring section. Therefore, the above main circuit section functions as a shield portion between the above control circuit substrate section and the power wiring section, and can restrain electric noises from the power wiring section that are transmitted to the control circuit substrate section. Thus, a conventionally required shield layer is unnecessary, and the number of parts can be reduced.

Further, since the above main circuit section and the above control circuit substrate section are adjacently arranged, the electric joining portion between the main circuit section and the control circuit substrate section can be arranged in a boundary portion of both the main circuit section and the control circuit substrate section, and it is not necessary to penetrate the above power wiring section. Therefore, it is further possible to restrain the influence of the electric noises from the power wiring section to the control circuit substrate section. Thus, in accordance with the present invention, it is possible to provide an electric power converter with a reduced number of parts that also restrains the influence of the noises from the power wiring section.

Further, to achieve the above second object, the mounting structure of a semiconductor device in the present invention has a bypass capacitor that is formed as a dielectric member by interposing one portion of a semiconductor module and one portion of a holding member (or a separate mediating member) between a semiconductor element of the semiconductor module and the holding member for holding the semiconductor module, the holding member holding the semiconductor module from both sides. Also, the bypass capacitor may be formed as a dielectric member by interposing one portion of a semiconductor module and one portion of a holding member (or a separate mediating member) between the semiconductor element and a case for storing the semiconductor module.

Namely, a first mounting structure of the semiconductor device in the present invention is constructed by a semiconductor module and first and second electrically conductive holding members for holding the semiconductor module from both sides through a first insulating member and a second insulating member, which forms dielectrics. The semiconductor module includes: a power semiconductor element; a first electrode plate and a second electrode plate respectively joined to one face and the other face of the semiconductor element; a connecting terminal with a control circuit for controlling the operation of the semiconductor element; and a resin mold having an insulating property for sealing the semiconductor element, the first electrode plate and the second electrode plate.

In accordance with the above mounting structure, noises generated during operation of the semiconductor module are absorbed by a noise restraining bypass capacitor that is constructed by the first electrode plate and/or the second electrode plate, the first holding member and/or the second holding member, and the first insulating member and/or the second insulating member that are located between the electrode plates and the holding members, thereby, the noise generated during operation of the semiconductor module is not emitted to an electric power line, etc. Namely, the emission of the noises generated in the power semiconductor element is restrained by the noise restraining bypass capacitor in which the insulating members, which are located between the electrode plates and the holding members, are dielectrics. As a result, a dedicated bypass capacitor for restraining the noise emission from the semiconductor module is not required, and labor and time for externally attaching this bypass capacitor are not required, so that cost is reduced.

Since the bypass capacitor is arranged near the semiconductor element and also arranged by each semiconductor element, the restraining effect of the emitted noises is reliable and effective. Further, since the holding members are electrically conductive, grounding is easy.

In the above mounting structure, it is preferable that one portion of the first electrode plate and the second electrode plate are exposed, and that the first insulating member and the second insulating member are plates having an insulating property that are interposed between the exposure portion of the first electrode plate and the second electrode plate and the first holding member and the second holding member. In accordance with this mounting structure, the plate having an insulating property that is interposed between the semiconductor module and the electrically conductive holding member becomes a dielectric member. Accordingly, a general-purpose semiconductor module and holding pipe can be used as they are, and thus costs can be kept to a minimum.

In the above mounting structure, it is preferable that one portion of the first electrode plate and the second electrode plate is exposed, and the first insulating member and the second insulating member are films having an insulating property that are integrated with a resin mold and cover the exposed portion of the first electrode plate and the second electrode plate. In accordance with this mounting structure, the films having an insulating property that are integrated with the resin mold of the semiconductor module become dielectric members. Further, one portion of the first electrode plate and the second electrode plate may be exposed, and the first insulating member and the second insulating member may also be a film having an insulating property that is integrated with the first holding member and the second holding member so as to be opposed to the exposed portion of the first electrode plate and the second electrode plate. In accordance with this mounting structure, the film having an insulating property that is integrated with a holding pipe becomes a dielectric member. Accordingly, the bypass capacitor can easily be formed with only slight improvements to a general-purpose semiconductor module and holding pipe.

In the above mounting structure, the first holding member and the second holding member are preferably connected to the ground. When the holding members are connected to the ground, the bypass capacitors more reliably restrict noises. Further, a structure for circulating an electrically conductive cooling medium into the first holding member and the second holding member can also be used to connect to the ground. In this case, the cooling medium that was originally used as a cooling means for the semiconductor element can be utilized as a grounding means to more reliably restrain noises.

Namely, a second mounting structure of the semiconductor device in the present invention is constructed by; a semiconductor module; a first holding member and a second holding member having an insulating property having first and second electrically conductive internal members inserted thereinto, the first and second holding members hold the semiconductor module from both sides in order to become a dielectric member. The semiconductor module includes a power semiconductor element; a first electrode plate and a second electrode plate respectively joined to one face and the other face of the semiconductor element; a connecting terminal with a control circuit for controlling the operation of the semiconductor element; and a resin mold having an insulating property for sealing the semiconductor element, the first electrode plate and the second electrode plate.

In accordance with the above mounting structure, noises generated during operation of the semiconductor module are absorbed by a noise restraining bypass capacitor that restrains noises and is constructed by the first electrode plate and/or the second electrode plate, the first internal member and/or the second internal member, and wall portions of the first holding member and/or the second holding member that are located between the electrode plates and the internal members, and thereby, the generated noises are not emitted to an electric power line, etc. As its result, a dedicated bypass capacitor for restraining noise emission is not required, and labor and time for externally attaching this bypass capacitor are also not required thereby reducing costs. Since the bypass capacitor is arranged near the semiconductor element and also arranged by each semiconductor element, generated noises can reliably and effectively be restrained. Further, since the holding members have an insulating property, a wider variety of materials, which includes lighter materials, may be selected.

In the above mounting structure, the first internal member and the second internal member are preferably connected to the ground. Further, the first internal member and the second internal member may also have a structure for circulating an electrically conductive cooling medium and be capable of grounding this cooling medium. If the first internal member and the second internal member are grounded, noises can be more reliably restrained.

Further, a third mounting structure of the semiconductor device in the present invention is constructed by a semiconductor module and a case for storing an electrically conductive cooling medium by closely arranging plural semiconductor modules that are made of metal within the cooling medium. The semiconductor module includes a power semiconductor element; a first electrode plate and a second electrode plate respectively joined to one face and the other face of the semiconductor element; a connecting terminal with a control circuit for controlling the operation of the semiconductor element; and a resin mold having an insulating property for sealing the semiconductor element, the first electrode plate and the second electrode plate.

In accordance with the above mounting structure, noises generated during the operation of the semiconductor module are absorbed by a noise restraining bypass capacitor that restrains noises and is constructed by the first electrode plate and/or the second electrode plate, the cooling medium, the first mold portion and/or the second mold portion of the resin mold that is located between the electrode plates and the cooling medium, so that the generated noises are not emitted to an electric power line, etc. Namely, the emission of the noises generated in the power semiconductor element is restrained by the noise restraining bypass capacitor in which the mold portions of the resin mold, which are located between the electrode plates and the cooling medium, form a dielectric member. As a result, a dedicated bypass capacitor for restraining the generated noise emission is not required, and labor and time for externally attaching this bypass capacitor are also not required thereby reducing costs.

Since the bypass capacitor is arranged near the semiconductor element and also arranged by each semiconductor element, the generated noises are reliably and effectively restrained. Further, since the case for storing the cooling medium also functions as a positioning means of the semiconductor module, no holding member is required and the number of parts required can be reduced and an assembly process can be simplified.

In the above mounting structure, the cooling medium is preferably connected to the ground. Thus, the bypass capacitors reliably and effectively restrain the generated noises.

PREFERRED EMBODIMENTS OF THE INVENTION

1. Electric Power Converter

Figure 1:
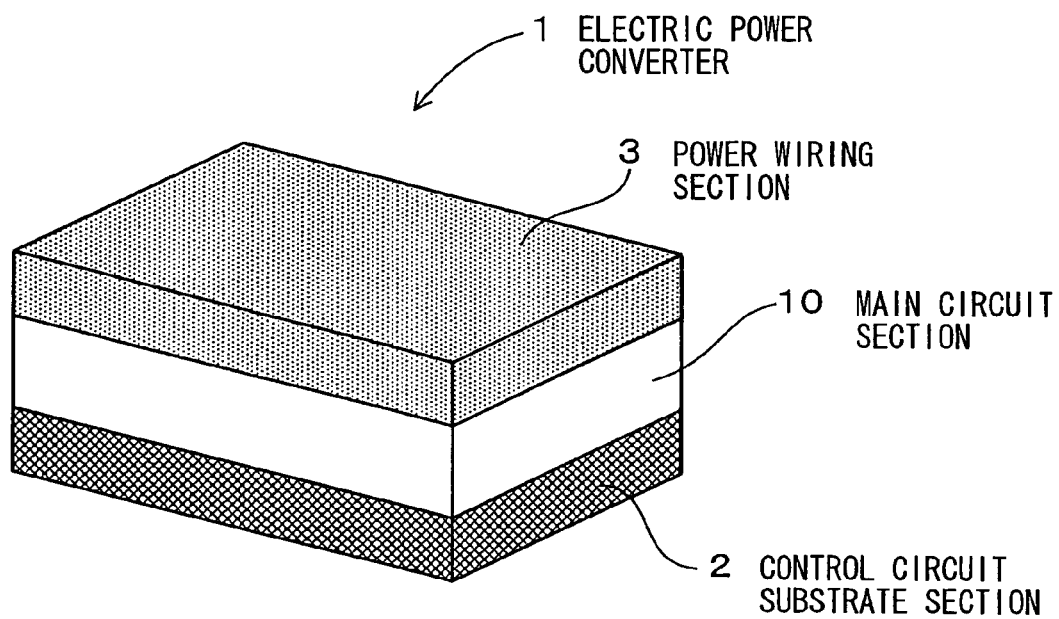
FIG. 1 is an explanatory view showing the arrangement of each portion of an electric power converter according to a first embodiment of the present invention.

First, the summary of an electric power converter will be explained. In the electric power converting circuit, for example, a power wiring section is constructed by a bus bar connected to a three-phase motor, etc., a connecting portion of the bus bar, etc. and a main electrode terminal of a semiconductor module, etc. In the power wiring section, an electric current that is to be controlled is inputted to the semiconductor module, and is outputted from the semiconductor module.

A control circuit substrate section is a section connected to a signal terminal of the semiconductor module, and having a control circuit for sending a control signal to the semiconductor module. A main circuit section is constructed by including the semiconductor module and a cooling device for cooling this semiconductor module.

A structure constructed by a semiconductor element of one kind or plural semiconductor elements and having a main electrode terminal and a signal terminal is used as the semiconductor module. As described later, this semiconductor module is preferably is a both-sides cooling type. Namely, the semiconductor module preferably has a structure that is able to cool the semiconductor module from one face and another face opposed to this one face.

An electronic part connected to the semiconductor module is preferably arranged together in the power wiring section. Namely, the electronic part itself, or the bus bar connected to this electronic part, may emit an electric noise. Accordingly, it is preferable to arrange the electronic part in the power wiring section. Thus, it is possible to restrain the influence of the electric noise emitted from the electronic part from being transmitted to the control circuit substrate section. For example, parts such as a reactor, a capacitor, etc. may be the electronic part. A voltage raising circuit is constructed by these electronic parts.

The semiconductor module is constructed from a module main body portion for building-in a semiconductor part, a main electrode terminal projected from this module main body portion, and a signal terminal projected in a direction different by about 180 degrees from the projected main electrode terminal. The cooling device has a pair of refrigerant tubes arranged so as to nip and support the module main body portion from both sides. The module main body portion is constructed to be cooled from both sides by circulating a cooling medium into the refrigerant tube. The semiconductor module is preferably arranged such that the main electrode terminal and the signal terminal are respectively projected in directions different from each other and approximately perpendicular to the longitudinal direction of the pair of refrigerant tubes.

In this case, the semiconductor module and the refrigerant tube can be arranged in parallel with each other, and the main electrode terminal and the signal terminal can be respectively arranged in different directions that are perpendicular to the arranged direction. Therefore, the control circuit substrate section and the power wiring section can be very easily distributed and arranged on both sides of the main circuit section in which the semiconductor module and the refrigerant tube are arranged.

The main circuit section has a laminating structure in which plural refrigerant tubes and plural semiconductor modules are alternately laminated. The main electrode terminal of the semiconductor module is preferably projected from one face in a direction perpendicular to this laminating direction, and the signal terminal is also preferably projected from its opposite face. In this case, the laminating structural body of the semiconductor module and the refrigerant tube may be easily integrated as one unit so that the entire main circuit section can be made compact and can be easily manufactured.

In the arrangement of the semiconductor module and the refrigerant tube, it is also possible to adopt an arrangement in which two refrigerant tubes are formed as one unit in one line to nip and support the semiconductor module. In this case, plural rows, each constructed by this one unit, are manufactured and are arranged in parallel. The plural refrigerant tubes are connected by a pair of header portions so that the entire structure is formed as a unit.

First Embodiment

An electric power converter in accordance with a first embodiment of the present invention will next be explained by using FIGS. 1 to 4. An electric power converter 1 according to the first embodiment is an electric power converter for a hybrid automotive vehicle. As shown in FIG. 1, the electric power converter 1 is constructed by a main circuit section 10, a control circuit substrate section 2 and a power wiring section 3. The main circuit section 10 is interposed between the control circuit substrate section 2 and the power wiring section 3.

As shown in FIGS. 2 and 3A, 3B, 3C, the main circuit section 10 is constructed by a semiconductor module 4, which constitutes one portion of the electric power converting circuit, and a cooling device 5 for cooling this semiconductor module 4. The control circuit substrate section 2 is a substrate electrically connected to a signal terminal 42 of the semiconductor module 4, and the control circuit substrate section 2 has an unillustrated control circuit for controlling the operation of the semiconductor module 4. The power wiring section 3 is a section connected to a main electrode terminal 41 of the semiconductor module 4 and supplies an electric current to the semiconductor module 4 and also stops the supply of the electric current.

Figure 2:
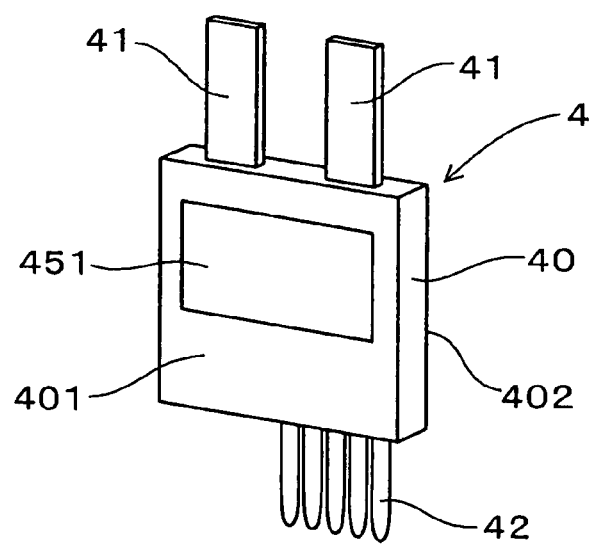
FIG. 2 is an explanatory view showing a semiconductor module according to the first embodiment.
Figure 3A:
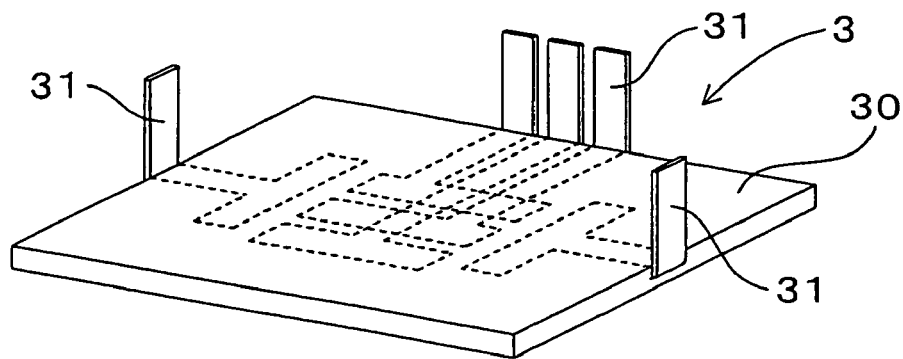
FIG. 3A is an explanatory view showing a power wiring section.
Figure 3B:
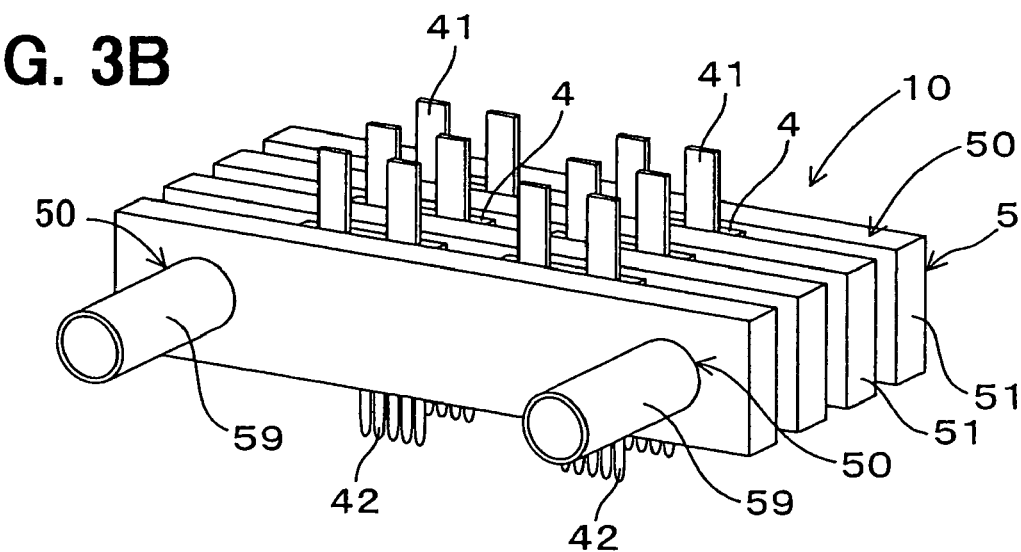
FIG. 3B is an explanatory view showing a main circuit section.

In the first embodiment, as shown in FIGS. 2 and 3B, the semiconductor module 4 is constructed by a module main body portion 40 building-in a semiconductor element, the main electrode terminal 41 is projected from the module main body portion 40, and the signal terminal 42 is projected in a direction about 180 degrees from the projecting direction of the main electrode terminal 41. In the module main body portion 40, a heat radiating plate 451 is conducted to the main electrode terminal 41 and is exposed to both main faces 401 and 402 of this module main body portion 40.

As shown in FIG. 3B, the cooling device 5 has a pair of refrigerant tubes 51 arranged to nip and support the module main body portion 40 from both faces. In this example, two semiconductor modules 4 are nipped and supported in parallel between the pair of refrigerant tubes 51. The main circuit section 10 is entirely constructed by alternately laminating the refrigerant tube 51 and a line of the semiconductor module 4. Thus, all the semiconductor modules 4 attain a state in which both the faces 401 and 402 of the semiconductor modules 4 are nipped and supported by the refrigerant tube 51.

Each refrigerant tube 51 has an unillustrated refrigerant passage in its interior, and is constructed to circulate a cooling medium to this refrigerant passage. As shown in FIG. 3B, a bellows pipe 59 is arranged so as to respectively connect both ends of the plural refrigerant tubes 51 so that a header portion 50 is formed. The module main body portion 40 is cooled from both the faces 401 and 402 by circulating the cooling medium into the refrigerant tube 51. Each semiconductor module 4 is arranged such that the main electrode terminal 41 and the signal terminal 42 are projected in different directions and approximately perpendicular to the longitudinal direction of the pair of refrigerant tubes 51. Thus, the control circuit substrate section 2 and the power wiring section 3 are very easily distributed and arranged on both faces of the main circuit section 10 in which the semiconductor module 4 and the refrigerant tube 51 are arranged.

Figure 3C:
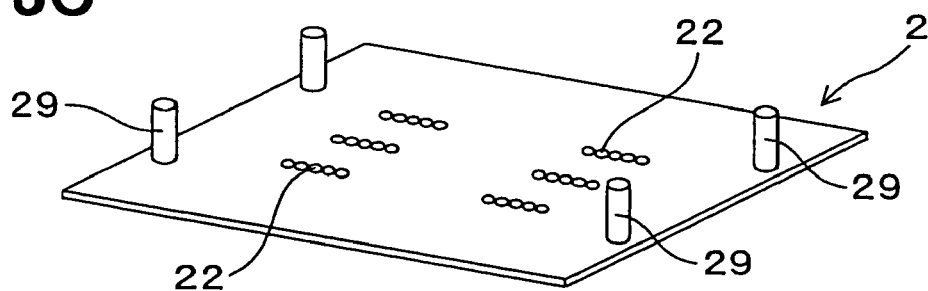
FIG. 3C is an explanatory view showing a control circuit substrate section according to the first embodiment.
Figure 4:
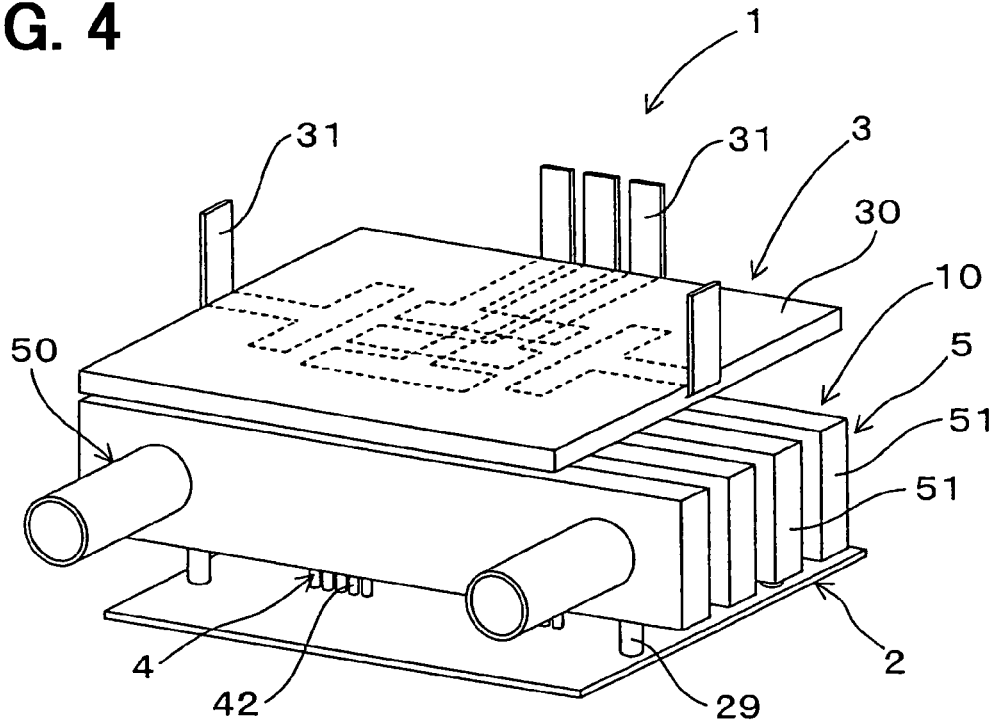
FIG. 4 is an explanatory view showing the construction of the electric power converter according to the first embodiment.

As shown in FIG. 3C, the control circuit substrate section 2 has plural connecting holes 22 for inserting and arranging the signal terminal 42 of the semiconductor module 4. The control circuit substrate section 2 is constructed such that the control circuit and the signal terminal 42 are electrically connected by inserting the signal terminal 42 into this connecting hole 22. A support bar 29 rising in the control circuit substrate section 2 abuts on the refrigerant tube 51 of the main circuit section 10, and functions as a spacer for holding the distance between the main circuit section 10 and the control circuit substrate section 2.

As shown in FIG. 3A, the power wiring section 3 is constructed by plural bus bars 31 connected to an unillustrated three-phase motor, and a resin mold portion 30 for molding one portion of these bus bars 31. Plural unillustrated joining terminal portions are joined to the main electrode terminal 41 of the semiconductor module 4 and are arranged on a face 302 facing the main circuit section 10 of the power wiring section 3.

As shown in FIGS. 3A, 3B, 3C and 4, the power wiring section 3 is adjacently arranged above the main circuit section 10, and the control circuit substrate section 2 is adjacently arranged below the main circuit section 10. The main electrode terminal 41 of the semiconductor module 4 and the power wiring section 3 are electrically connected, and the signal terminal 42 is electrically joined to the control circuit substrate section 2 so that the electric power converter 1 of this example is obtained.

As mentioned above, the electric power converter 1 of this example is arranged such that the main circuit section 10 is constructed by the semiconductor module 4 and its cooling device 5 is nipped and supported by the control circuit substrate section 2 and the power wiring section 3. Therefore, the main circuit section 10 functions as a shield portion between the control circuit substrate section 2 and the power wiring section 3, and it is possible to restrain electric noises from the power wiring section 3 that are transmitted to the control circuit substrate section 2. Thus, a shield layer conventionally required is not necessary and the number of parts can be reduced.

Since the main circuit section 10 and the control circuit substrate section 2 are adjacently arranged, the electric joining portion between the main circuit section 10 and the control circuit substrate section 2 can be arranged in a boundary portion of both the main circuit section 10 and the control circuit substrate section 2, and it is not necessary to penetrate the power wiring section 3. Therefore, the influence of electric noises from the power wiring section 3 transmitted to the control circuit substrate section 2 can be further restrained.

Further, this example adopts a structure in which both faces can be cooled and the main electrode terminal 41 and the signal terminal 42 as the semiconductor module 4 are projected in different directions from each other by about 180 degrees. This structure is utilized at its maximum when the laminating structure with the refrigerant tube 51 is formed as mentioned above. Further, the structure for respectively projecting the main electrode terminal 41 and the signal terminal 42 in different directions that are perpendicular to this laminating direction is set. Thus, the cooling efficiency of the semiconductor module 4 can be improved, and a structure for distributing and arranging the control circuit substrate section 2 and the power wiring section 3 on both the faces of the main circuit section 10 is easily achieved.

This example is to a structure in which the main circuit section 10 is arranged above the control circuit substrate section 2, and the power wiring section 3 is arranged further above the main circuit section 10. However, while this relative relation may be maintained as it is, it is possible to change this arrangement into a mode for that is rotated in the vertical direction, or a mode inverted by 90 degrees, etc.

Second Embodiment

Figure 5:
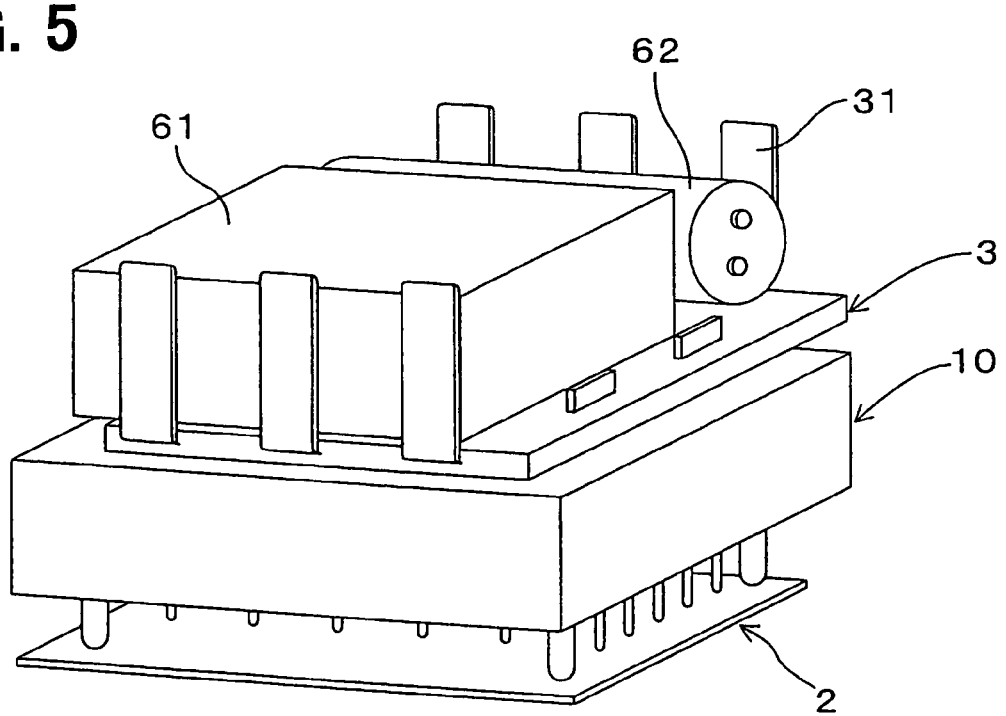
FIG. 5 is an explanatory view showing the construction of an electric power converter according to a second embodiment of the present invention.
Figure 6:
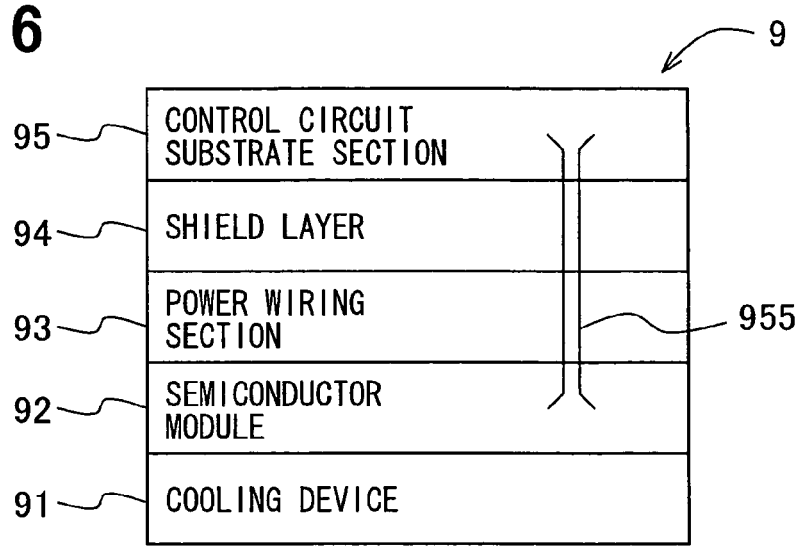
FIG. 6 is an explanatory view showing the arrangement of each portion of an electric power converter in a conventional example.

As shown in FIG. 5, a second embodiment is an example in which a reactor 61 and a capacitor 62, which constitute one portion of a voltage raising circuit, are arranged in the power wiring section 3 of the electric power converter 1, based on the electric power converter 1 according to the first embodiment. In this case, it is possible to restrain the influence of electric noises generated from the reactor 61 and the capacitor 62, which constitute the voltage raising circuit, to the control circuit substrate section 3. With respect to the other parts and arrangements, operations and effects similar to those in the first embodiment are obtained.

2. Mounting Structure

Next, the second embodiment of the mounting structure of a semiconductor device in the present invention will be explained. This mounting structure of the semiconductor device can be classified into the following three types in accordance with a forming method of a noise restraining bypass capacitor, particularly, depending on what becomes a dielectric (insulator) member.

(1) In a first type, a plate and a film having an insulating property that is interposed between a semiconductor module and a holding member for holding, or nipping and supporting, the semiconductor module from both the front and rear sides becomes the dielectric member, and various modes are also included. In a first mode, an electrode plate of the semiconductor module is partially exposed from a resin mold of the semiconductor module to form one electrode plate. The holding member is constructed by an electrically conductive material to form the other electrode plate.

It is desirable to connect the bypass capacitor to both a first electrode plate of the front face side of the semiconductor module and a second electrode plate of the rear face side of the semiconductor module. However, such a construction is not indispensable, and the bypass capacitor may be also connected to only the first or second electrode plate. To make this connection, a plate of the insulating property, etc. may be interposed only between one electrode plate and the holding member opposed to this one electrode plate. This construction is similarly used in second to fourth modes of the first type of mounting structure, and second and third types of the mounting structure described later.

In the second mode, one portion (mold portion) of a resin mold for covering the electrode plate of the semiconductor module becomes the dielectric member. In the third mode, one portion of the exposed electrode plate of the semiconductor module is covered with a film having an insulating property that is integrated with a resin mold, and this film becomes the dielectric member. In the fourth mode, a film having an insulating property that is integrated with the holding member and opposed to one portion of the exposed electrode plate of the semiconductor module becomes the dielectric member.

In any of the above modes, it is desirable to circulate the cooling medium into the interior of the holding member. The cooling medium restrains a rise in temperature of the semiconductor module, and also may connect the holding member to a vehicle body that is a ground when the cooling medium is electrically conductive.

(2) In the second type, the holding member for holding, or nipping and supporting, the semiconductor module from both the front and rear sides becomes the dielectric member, or the other electrode plate. Therefore, the holding member is constructed from insulating material, and an electrically conductive internal member is inserted into this holding member. The electrode plate of the semiconductor module is partially exposed. The cooling medium can be circulated into the holding member.

(3) The third type does not include a holding member for holding the semiconductor module from both the front and rear sides, etc. One electrode plate and the dielectric member are formed in the semiconductor module, and the other electrode plate is the electrically conductive cooling medium stored in a case that is manufactured by a metal. The electrode plate of the semiconductor module is covered with one portion (mold portion) of the resin mold. Plural semiconductor modules are positioned by the case in a predetermined state.

Each type and the mode in each type will next be explained with reference to the accompanying drawings.

Third Embodiment

Figure 7:
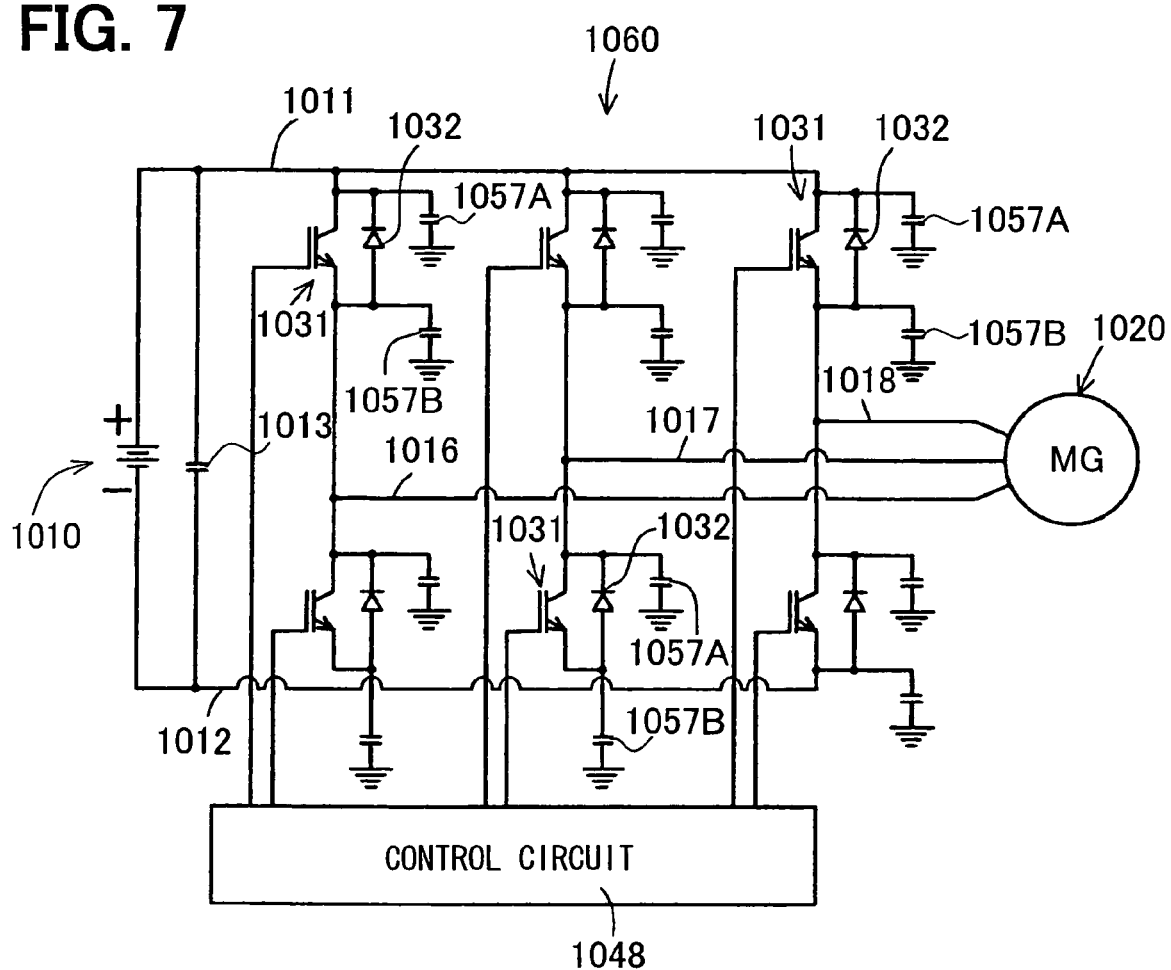
FIG. 7 is an explanatory view of the system of an electric automotive vehicle according to a third embodiment of the present invention.

A driving system of a hybrid automotive vehicle shown in FIG. 7 includes a battery 1010, a motor generator (MG) 1020 and an inverter device 1060. A smoothing capacitor 1013 and a semiconductor pair for a three-phase alternating current (U-phase, V-phase and W-phase) constitute the inverter device 1060 and are arranged between direct current bus bars 1011 and 1012, which are extended from a positive electrode terminal and a negative electrode terminal of the battery 1010. A U-phase line 1016 is extended to MG 1020 from between first and second U-phase semiconductor elements 1031 and 1032.

A V-phase line 1017 is extended to MG 1020 from between first and second V-phase semiconductor elements 1031 and 1032. A W-phase line 1018 is extended to MG 1020 from between first and second W-phase semiconductor elements 1031 and 1032.

Figure 8:
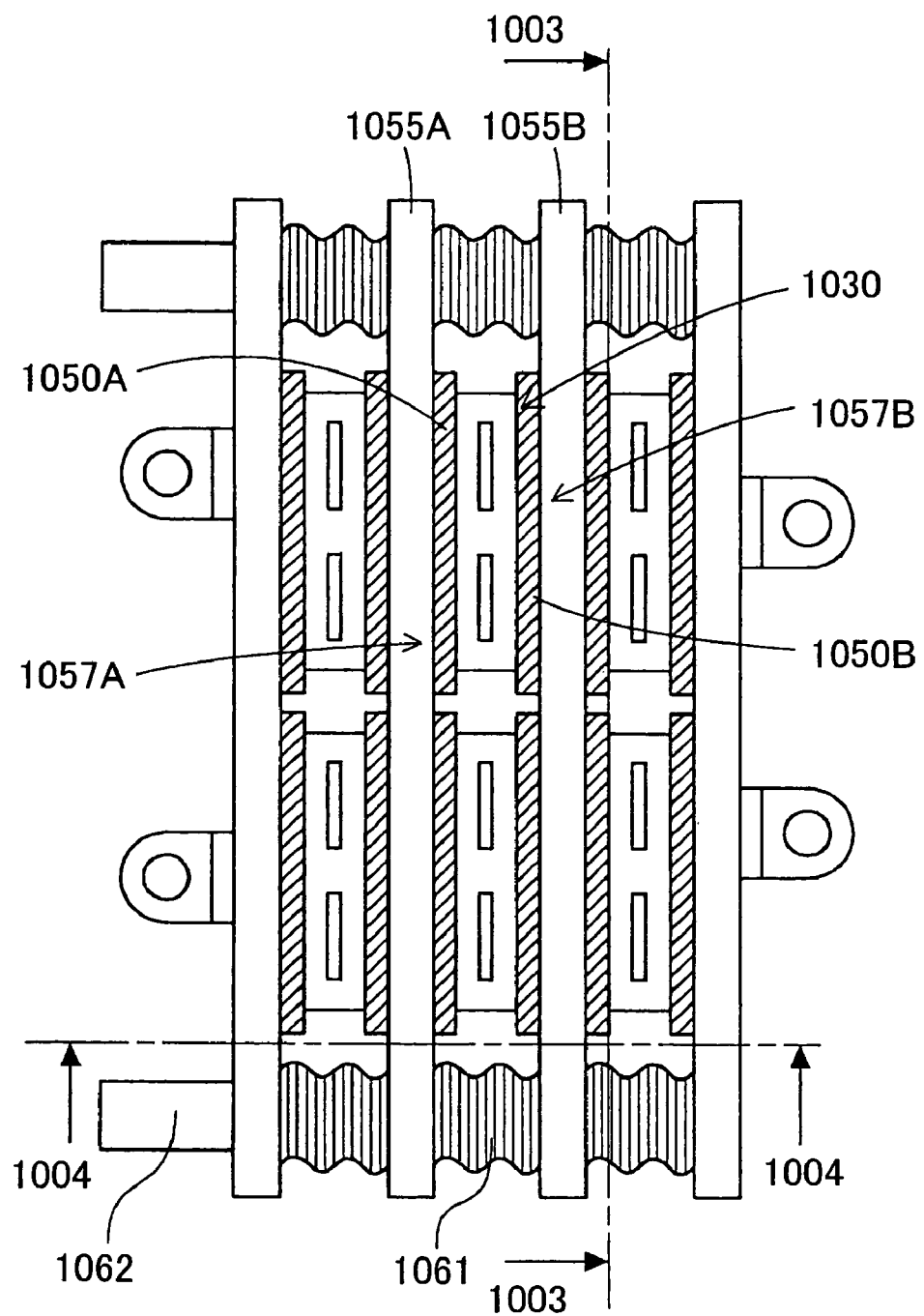
FIG. 8 is a front sectional view showing the mounting structure of a semiconductor device according to the third embodiment.
Figure 9:
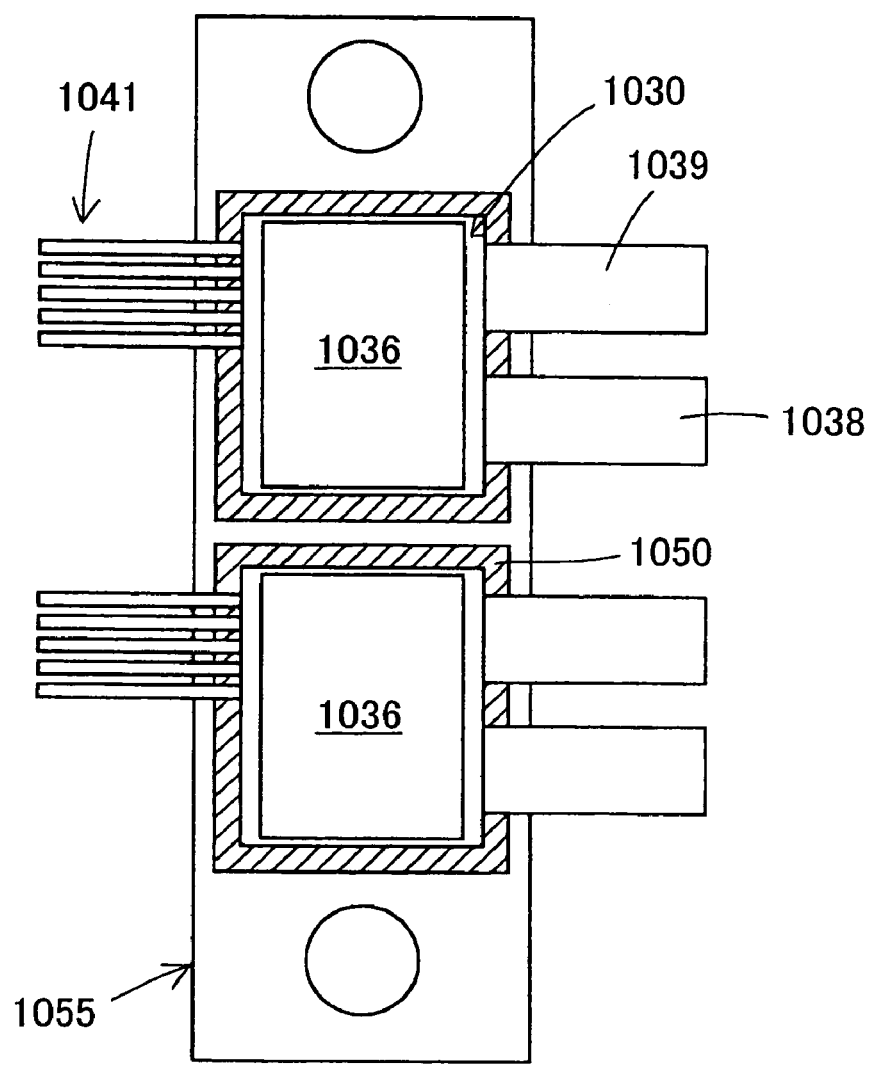
FIG. 9 is a sectional view taken along line IX-IX of FIG. 8.
Figure 10:
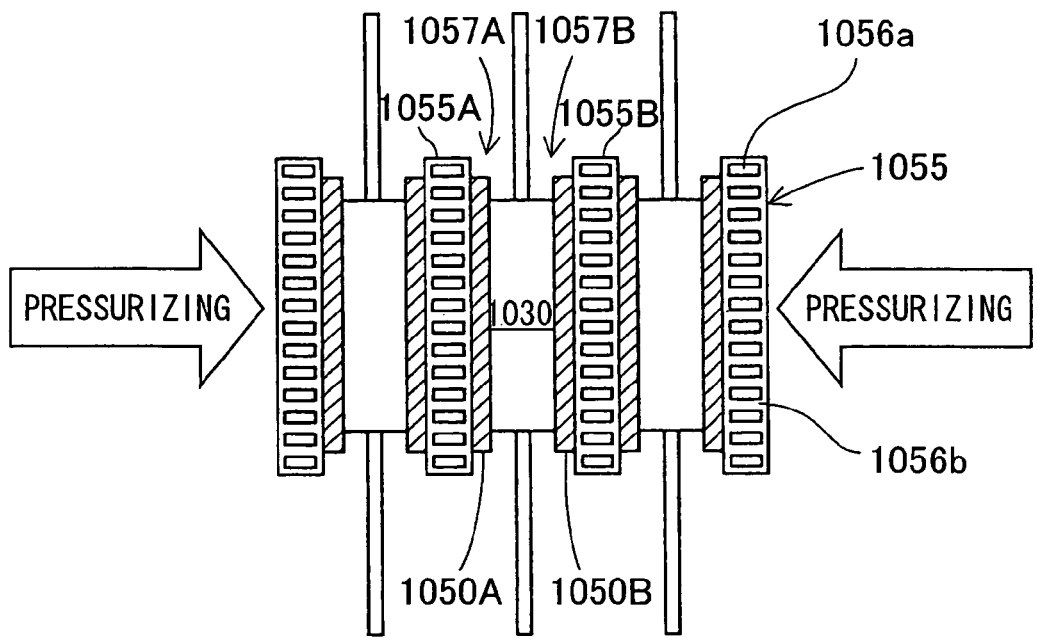
FIG. 10 is a sectional view taken along line X-X of FIG. 8.
Figure 11:
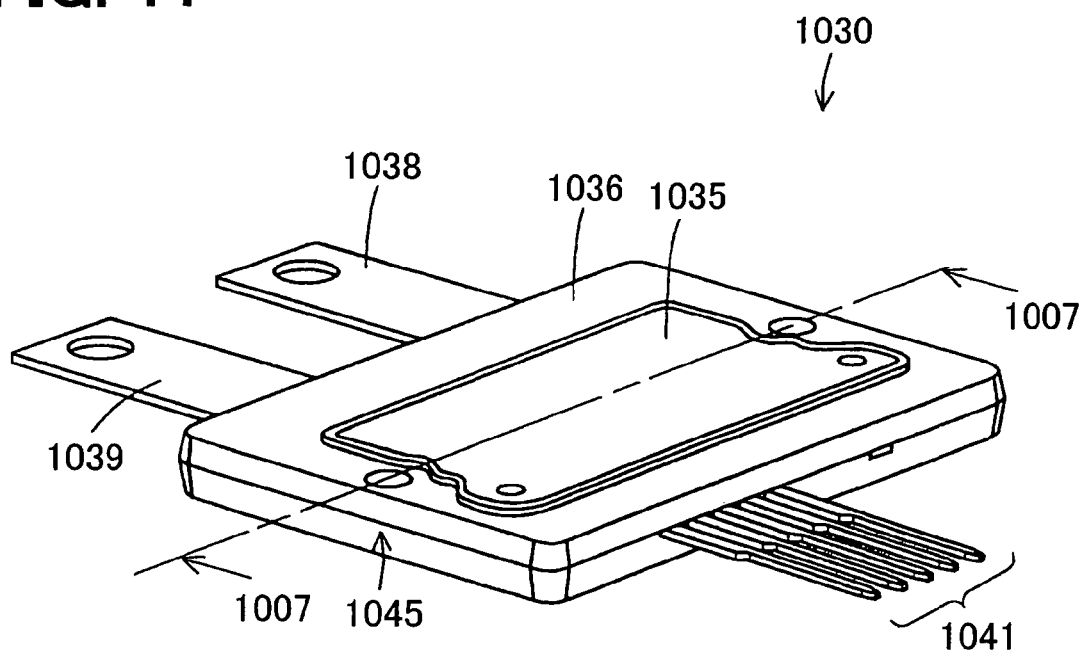
FIG. 11 is a perspective view of a semiconductor module according to the third embodiment.
Figure 12:
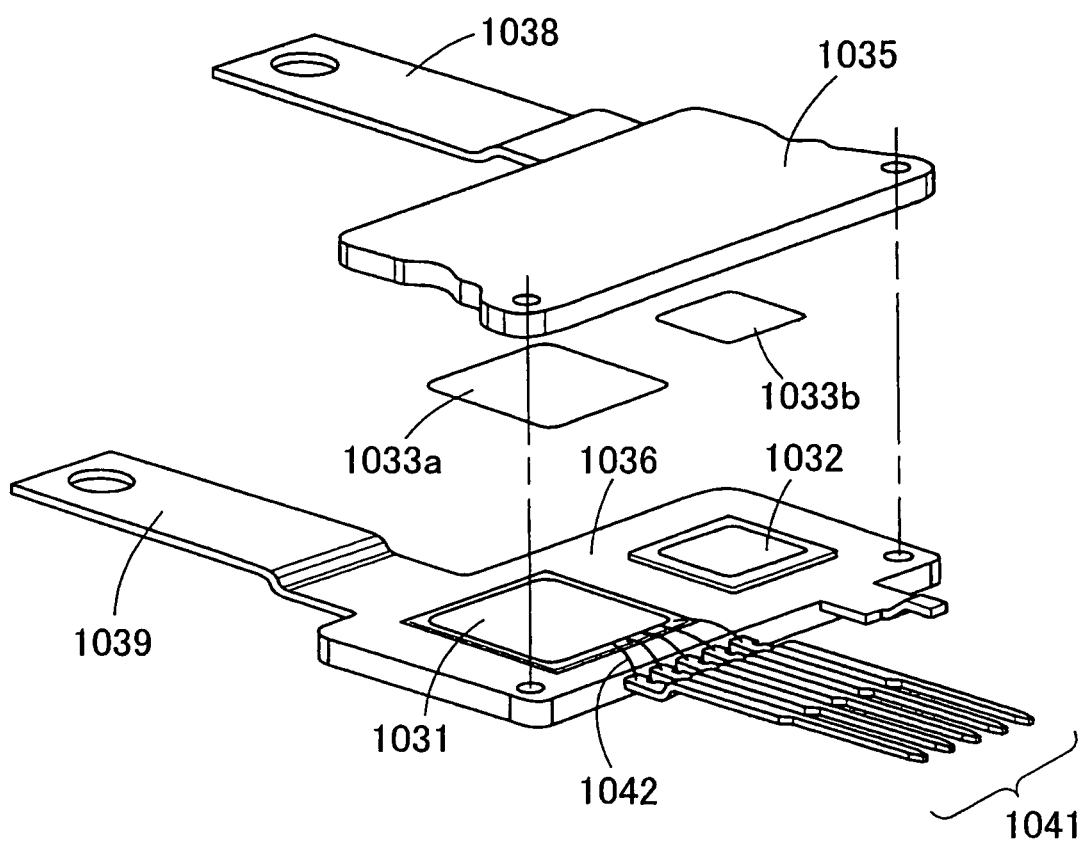
FIG. 12 is an exploded perspective view of the semiconductor module according to the third embodiment.
Figure 13A:
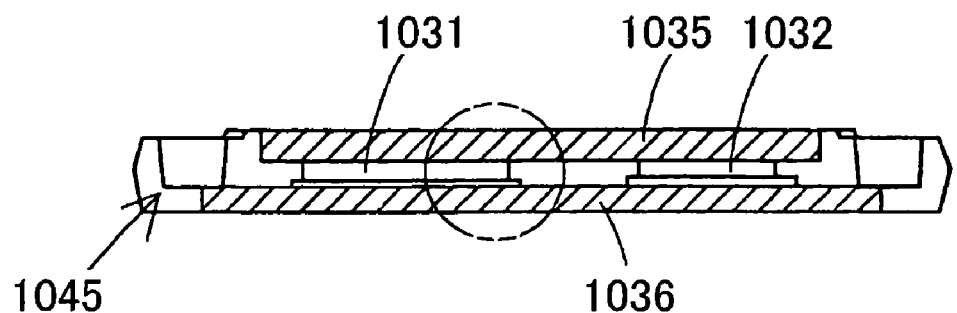
FIG. 13A is a sectional view taken along line XIIIA-XIIIA of FIG. 11.
Figure 13B:
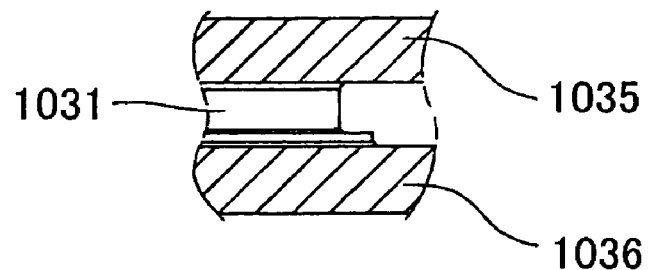
FIG. 13B is an enlarged view of a main portion of FIG. 13A.
Figure 14:
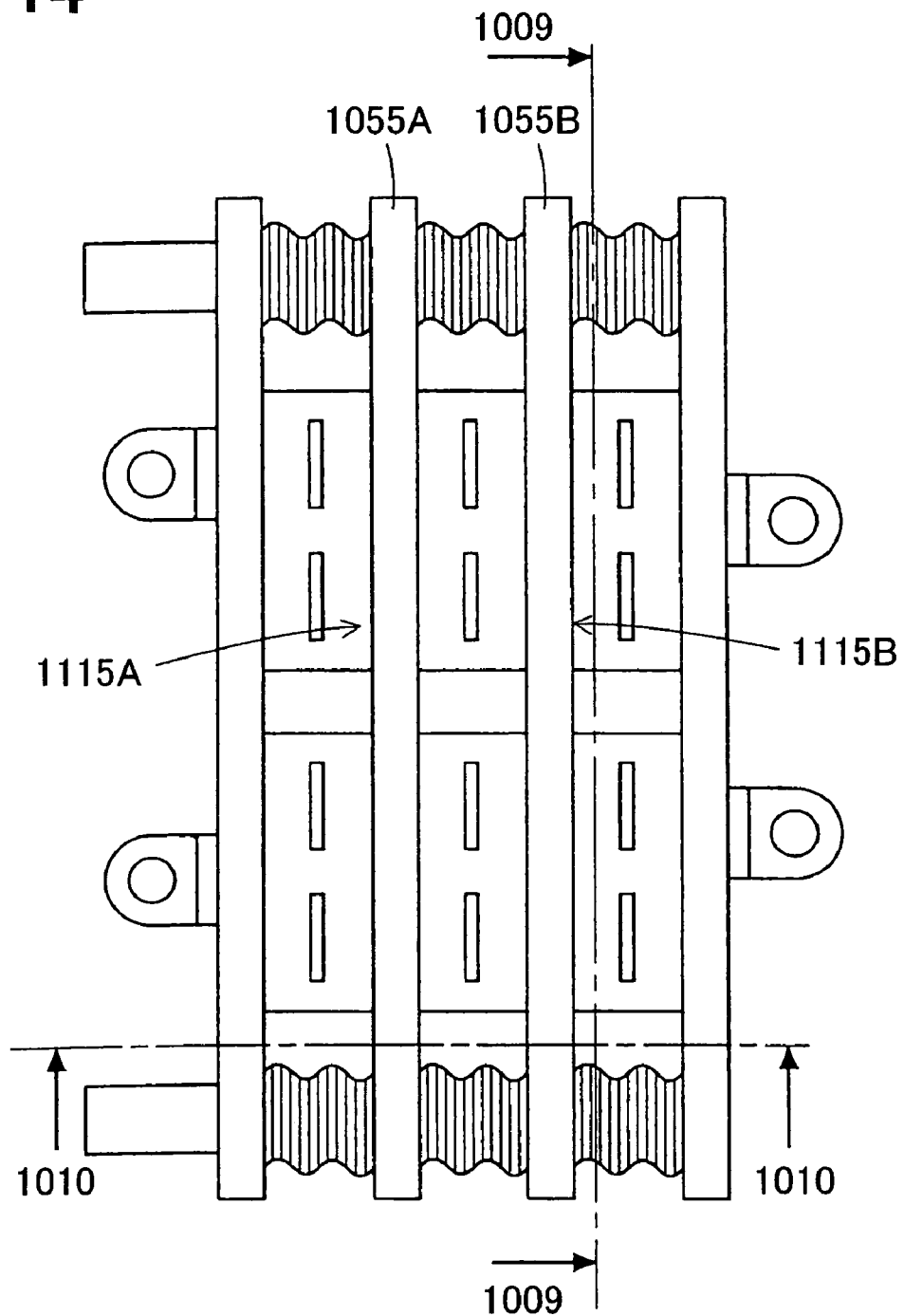
FIG. 14 is a front sectional view showing the mounting structure of a semiconductor device according to a fourth embodiment of the present invention.
Figure 15:
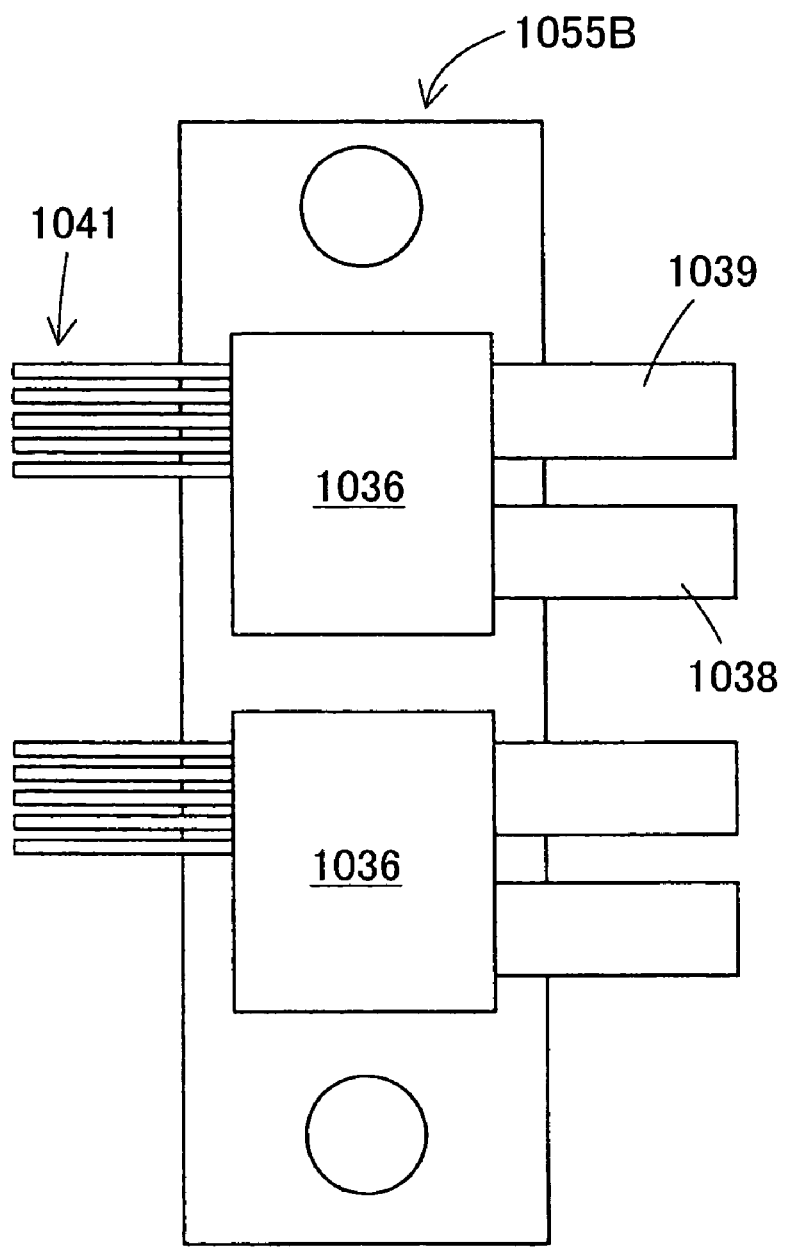
FIG. 15 is a sectional view taken along line XV-XV of FIG. 14.
Figure 16:
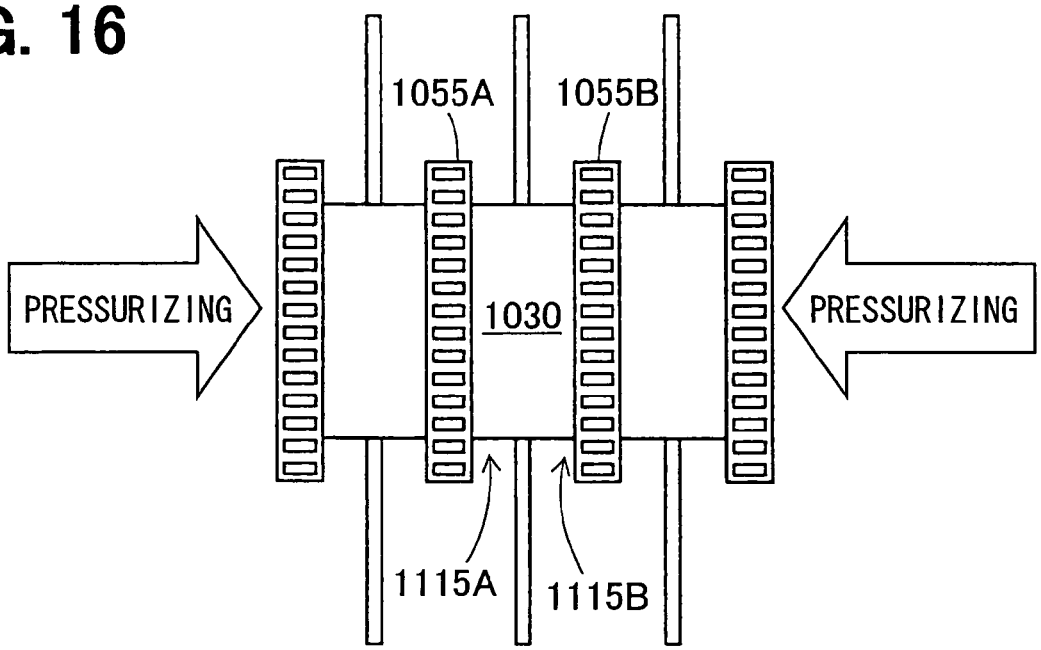
FIG. 16 is a sectional view taken along line XVI-XVI of FIG. 14.
Figure 17:
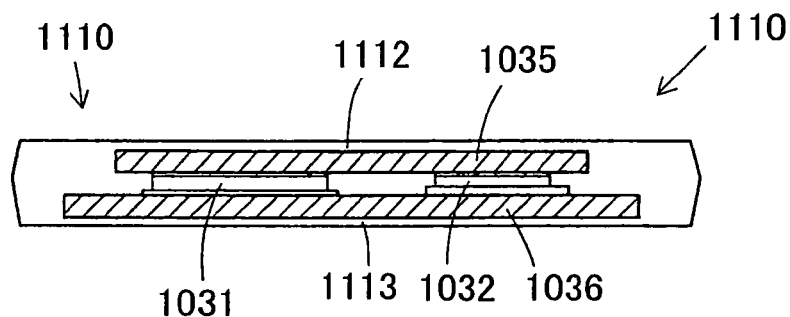
FIG. 17 is a cross-sectional view corresponding to FIG. 13A.

As shown in FIGS. 8 to 10, the inverter device 1060 is constructed by alternately laminating a holding pipe 1055 and plural semiconductor modules 1030 through an insulating material 1050 in the height direction. As shown in FIGS. 11 to 13A and 13B, each semiconductor module 1030 includes a first semiconductor element (IGBT) 1031 and a second semiconductor element (fly wheel diode) 1032, a first electrode plate 1035 is joined to these front face sides through solders 1033a, 1033b, and a second electrode plate 1036 is joined to these substrate sides (rear face sides) through unillustrated solder.

A first driving electrode terminal 1038 and a second driving electrode terminal 1039 are respectively integrated with the first electrode plate 1035 and the second electrode plate 1036. A control electrode terminal 1041 is joined to the first semiconductor element 1031 by a signal line of a bonding wire 1042, etc. The control electrode terminal 1041 includes a gate terminal (G) and an emitter terminal (Ke) for turning the first semiconductor element 1031 on and off, an output terminal (K, A) of a temperature diode formed on the surface of the first semiconductor element 1031 for detecting its temperature, and an electric current detecting terminal (Se) for detecting an electric current that flows to the first semiconductor element 1031.

The first semiconductor element 1031 and the second semiconductor element 1032, the first electrode plate 1035 and the second electrode plate 1036, the first driving electrode terminal 1038 and the second driving electrode terminal 1039, and the control terminal 1041, etc. are sealed by a resin mold 1045. The resin mold 1045 is filled between the first electrode plate 1035 and the second electrode plate 1036, and secures the insulation between both the electrode plates 1035 and 1036. The resin mold 1045 also attaches the connecting terminal 1041, and secures the insulation between the first electrode plate 1035, the second electrode plate 1036 and the connecting terminal 1041. The rear faces of the first electrode plate 1035 and the second electrode plate 1036 are exposed. The semiconductor module 1030 has a flat rectangular shape.

Returning to FIGS. 8 to 10, and the insulating material 1050 is constructed by a plate and a film of e.g., aluminum nitride and silicon nitride, and has a rectangular shape slightly greater than that of the semiconductor module 1030. The holding pipe (nipping and supporting pipe) 1055 is molded by an extrusion molding method of aluminum, etc., and has an air gap portion 1056a partitioned by a fin 1056b and extended in the longitudinal direction. The holding pipe 1055 has a width slightly greater than the widths of the electrode plates 1035, 1036 of the semiconductor module 1030, and also has a length able to arrange plural semiconductor modules 1030 on this holding pipe 1055. The air gap portion 1056a is penetrated in the longitudinal direction, and the electrically conductive cooling medium is circulated into the air gap portion 1056a.

Here, an assembly body of the plural semiconductor modules 1030 are arranged in parallel, an upper (first) holding pipe 1055A on its front face side, and a lower (second) holding pipe 1055B on its rear face side will be considered. The upper holding pipe 1055A is opposed to the first electrode plate 1035 through a first insulating plate 1050A, and the lower holding pipe 1055B is opposed to the second electrode plate 1036 through a second insulating plate 1050B.

The first driving electrode terminal 1038 and the second driving electrode terminal 1039 are projected onto one side of the upper holding pipe 1055A and the lower holding pipe 1055B, and are respectively connected to a positive direct current bus bar 1011 and a negative direct current bus bar 1012. Alternating current bus bars 1016 to 1018 are connected to MG 1020. The control electrode terminal 1041 is projected from the other side, and is connected to the control circuit 1048. The holding pipes 1055A, 1055B are connected to one portion of the car body of a hybrid automotive vehicle.

As a result, the first insulating plate 1050A that is an electrically nonconductive material exists between the first electrode plate 1035, which is an electrically conductive material, and the first holding pipe 1055A, and a first bypass capacitor 1057A is formed by these three members. Similarly, a second bypass capacitor 1057B is formed by the second electrode plate 1036, the second holding pipe 1055B, and the second insulating plate 1050B that exist between the second electrode plate 1036 and the second holding pipe 1055B.

A bellows member 1061 is interposed between both ends of the adjacent upper holding pipe 1055A and lower holding pipe 1055B. Both these ends are adhered to the upper holding pipe 1055A and the lower holding pipe 1055B by brazing, adhesion, etc. and create an air-tight seal. The cooling medium is supplied from a pipe 1062 to the bellows member 1061. Accordingly, the cooling medium flows to the air gap portion 1056 of the holding pipe 1055. Thus, a circulating path of the cooling medium is formed by the pipe 1062, by an unillustrated piping pump and radiator, etc.

A laminating body of plural holding pipes 1055 and plural semiconductor modules 1030 is stored in an unillustrated metallic case. This metallic case is fixed to the car body of the electric automotive vehicle, and is electrically connected to this car body. The holding pipe 1055 is connected to the car body as the ground.

For example, during advancing, etc. after an idle stop, the direct current of the battery 1010 is converted into an alternating current by the inverter device 1060, and operates MG 1020. On the other hand, during running when the engine is in use, the generated alternating current is converted into a direct current by operating MG 1020, and charges the battery 1010. Since this action itself is publicly known, a detailed explanation is omitted here.

In accordance with the third embodiment, the following effects are obtained with respect to restraining noises. First, noises are restrained without mounting a special or dedicated bypass capacitor that reduces noises generated in the first semiconductor element 1031 and the second semiconductor element 1032 and are transmitted to bus bars 1011, 1012, 1016, etc. This is because the electrode plates 1035, 1036 become one electrode plate, the holding pipes 1055A, 1055B become the other electrode plate, the insulating plates 1050A, 1050B become a dielectric member, and the bypass capacitors 1057A, 1057B are formed by these members.

The insulating plates 1050A, 1050B are originally interposed for the electric insulation of the semiconductor elements 1031, 1032 and the holding pipes 1055A, 1055B, but also function as dielectrics from their nature (insulating property) and positions. As a result, it is not necessary to use time and labor to connect a dedicated bypass capacitor by a lead wire, and space is saved.

Secondly, the emitted noises are reliably restrained. This is because the capacitors 1057A, 1057B are respectively and individually connected to the first semiconductor element 1031 and the second semiconductor element 1032, and are located near the first semiconductor element 1031 and the second semiconductor element 1032, which generate noises.

Thirdly, the emitted noises are well restrained for at least two reasons. First, the first holding pipe 1055A and the second holding pipe 1055B are connected to the body of the vehicle through an electrically conductive LLC, a pump, a radiator, etc. Thus, the impedance of a path for bypassing the noises generated by semiconductor elements 1031, 1032 to the vehicle body is reduced. Furthermore, the fin 1056b is internally formed on the inner circumferential face of the air gap portion 1056a that improves the electric coupling of the holding pipe 1055 and the LLC.

Further, an excellent cooling effect is obtained with respect to the cooling of the first semiconductor element 1031 and the second semiconductor element 1032. This is because a double faced cooling system that is directly attached to the first holding pipe 1055A and the second holding pipe 1055B to internally circulate the cooling medium through the first electrode plate 1035, which is arranged on the front face of the semiconductor elements, and the second electrode plate 1036, which is arranged on the rear face of the semiconductor elements, is adopted.

Fourth Embodiment

FIGS. 14 to 17 disclose a fourth embodiment. In the fourth embodiment, one portion of a resin mold 1110 of the semiconductor module constitutes a dielectric member instead of the first insulating plate 1050A and the second insulating plate 1050B according to the third embodiment.

The fourth embodiment will next be described in detail. The front face of the first electrode plate 1035 and the rear face of the second electrode plate 1036 are not exposed, but are respectively covered with a first mold portion 1112 and a second mold portion 1113. As a result, a first bypass capacitor 1115A and a second bypass capacitor 1115B are formed by the first semiconductor element 1031 and the second semiconductor element 1032, the first holding pipe 1055A and the second holding pipe 1055B, and the first mold portion 1112 and the second mold portion 1113 located therebetween.

In accordance with the fourth embodiment, effects similar to those in the third embodiment are obtained. In addition, the semiconductor device can be compactly constructed. This is because the first mold portion 1112 and the second mold portion 1113 function as an insulating material between the first and second semiconductor elements 1031 and 1032 and the first and second holding pipes 1055A and 1055B, and also function as the dielectric bypass capacitor. Further, the first insulating plate 1050A and the second insulating plate 1050B in the third embodiment are not required.

Fifth Embodiment

Figure 18:
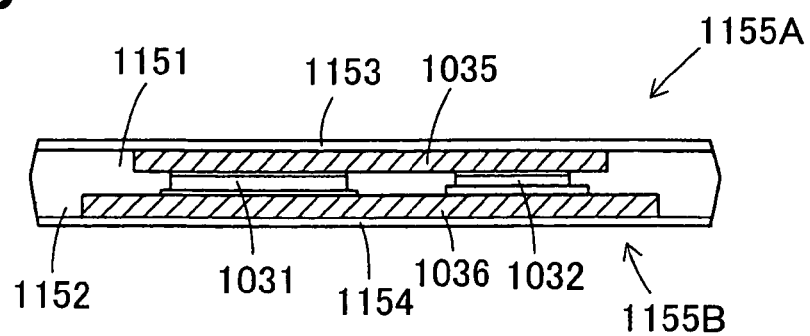
FIG. 18 is a cross-sectional view corresponding to FIG. 13A, according to a fifth embodiment of the present invention.
Figure 19:
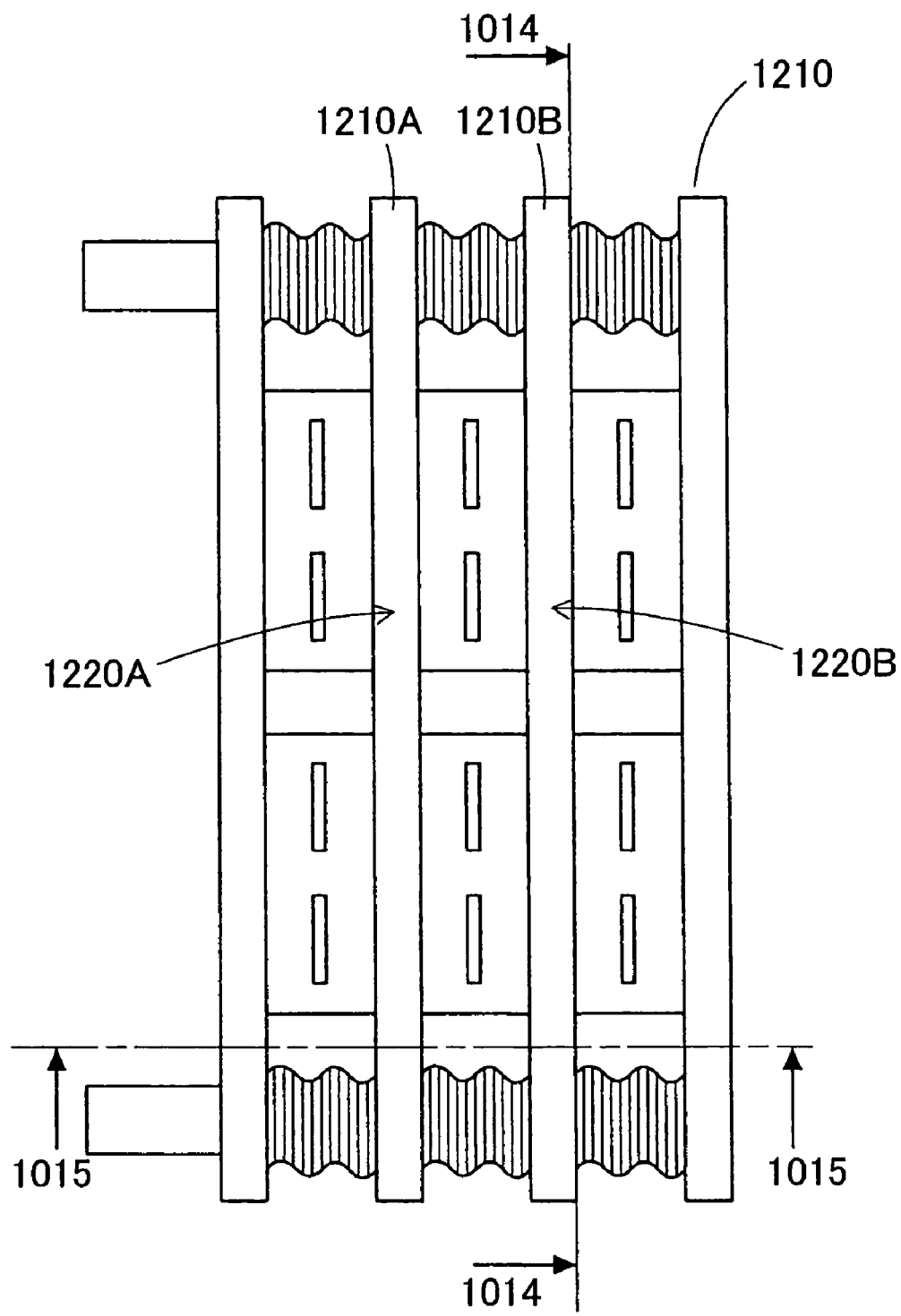
FIG. 19 is a front sectional view showing the mounting structure of a semiconductor device according to a sixth embodiment of the present invention.
Figure 20:
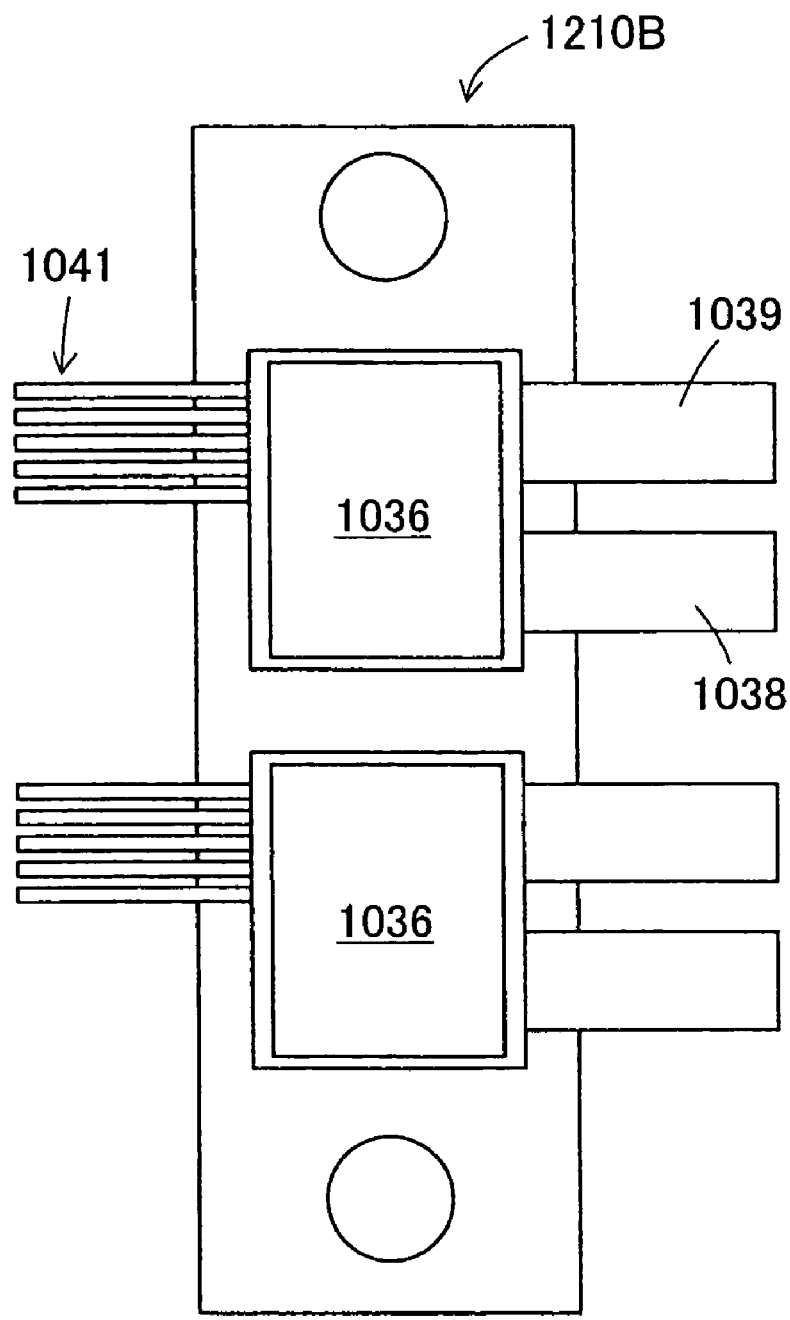
FIG. 20 is a sectional view taken along line XX-XX of FIG. 19.
Figure 21A:
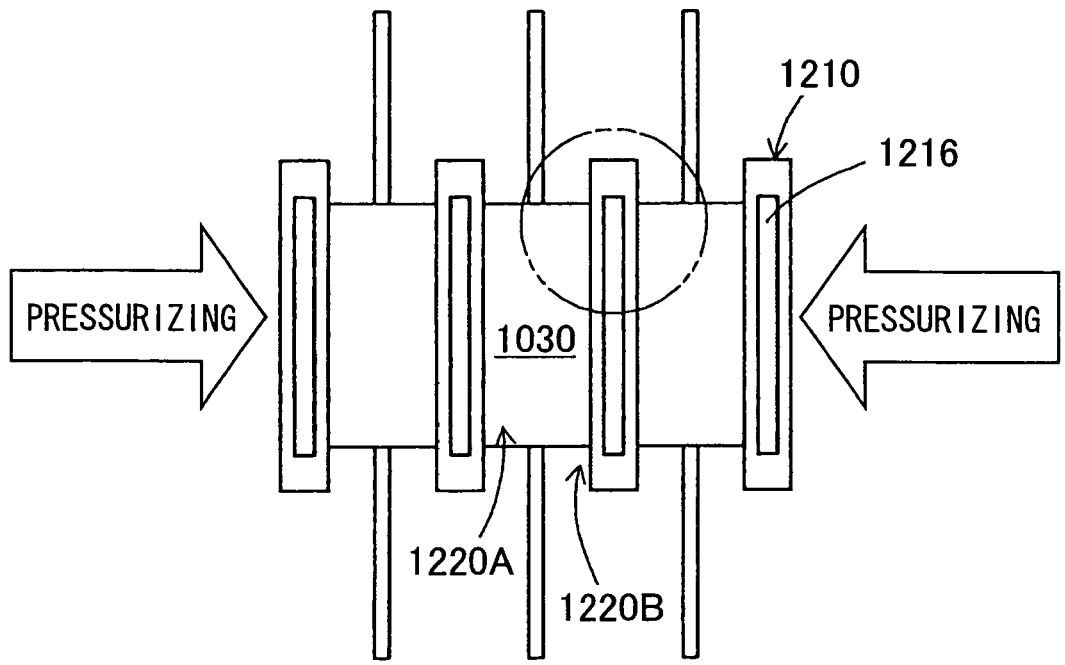
FIG. 21A is a sectional view taken along line XXI-XXI of FIG. 19.
Figure 21B:
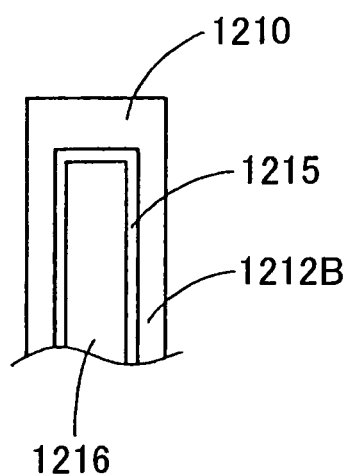
FIG. 21B is an enlarged view of a main portion of FIG. 21A.

In a fifth embodiment shown in FIG. 18, a first insulating film 1153 and a second insulating film 1154 are used as a dielectric member (instead of the insulating plates 1050A, 1050B as was the case in the third embodiment) and are formed in a first mold portion 1151 and a second mold portion 1152, and cover exposed portions of the first electrode plate 1035 and the second electrode plate 1036. For example, the first insulating film 1153 and the second insulating film 1154 are constructed by flame spraying a film of alumina and a film of DLC (diamond like carbon). As a result, bypass capacitors 1155A and 1155B are constructed by the first semiconductor element 1031 and the second semiconductor element 1032, the first holding pipe 1055A and the second holding pipe 1055B, and the first insulating film 1153 and the second insulating film 1154 located therebetween.

In the fifth embodiment, effects similar to those in the third embodiment are obtained. In addition, the capacities of the bypass capacitors 1155A, 1155B can be increased since the first insulating film 1153 and the second insulating film 1154 are located just near the first semiconductor element 1031 and the second semiconductor element 1032.

Furthermore, the capacities can be changed if the thicknesses of the first insulating film 1153 and the second insulating film 1154 are adjusted. As is well known, the capacities of the capacitors are inversely proportional to the thicknesses of the insulating films 1153, 1154. Accordingly, to increase the capacities, the thicknesses of the insulating films 1153, 1154 are decreased. In contrast to this, to decrease the capacities, the thicknesses of the insulating films 1153, 1154 are increased. Since the capacities are proportional to the surface areas of the electrode plates 1035, 1036, the surface areas of the electrode plates 1035, 1036 can be also adjusted in addition to adjusting the thicknesses of the insulating films 1153, 1154, or the surface areas of the electrode plates may be adjusted separately from adjusting the thicknesses of the insulating films.

The first insulating film 1153 and the second insulating film 1154 may be also formed in the first holding pipe 1055A and the second holding pipe 1055B by exposing the first electrode plate 1035 and the second electrode plate 1036 of the semiconductor module 1030.

Sixth Embodiment

In an embodiment 6 shown in FIGS. 19 to 21A and 21B, a holding pipe 1210 constructed by an insulating material such as resin, ceramics, etc. is used instead of the holding pipe 1055 manufactured by a metal. An electrically conductive inner pipe 1215 is inserted into a hollow portion of the holding pipe 1210 having an insulating property, and a cooling medium is circulated in its air gap portion 1216. The first electrode plate 1035 and the second electrode plate 1036 of the semiconductor module 1030 are exposed. Accordingly, bypass capacitors 1220A and 1220B are constructed by the first electrode plate 1035 and the second electrode plate 1036, first and second inner pipes 1215A and 1215B, and wall portions 1212A and 1212B of holding pipes 1210A and 1210B located therebetween.

In accordance with the sixth embodiment, the insulating wall portion 1212 of the holding pipe 1210 for circulating the cooling medium becomes a dielectric member in addition to achieving effects similar to those discussed in the third embodiment. Accordingly, it is unnecessary to form the dielectric member in the semiconductor module 1030, etc.

Further, since no electrically conductive property is required in the holding pipe 1210, the amount of materials that may be selected is increased.

Seventh Embodiment

Figure 22:
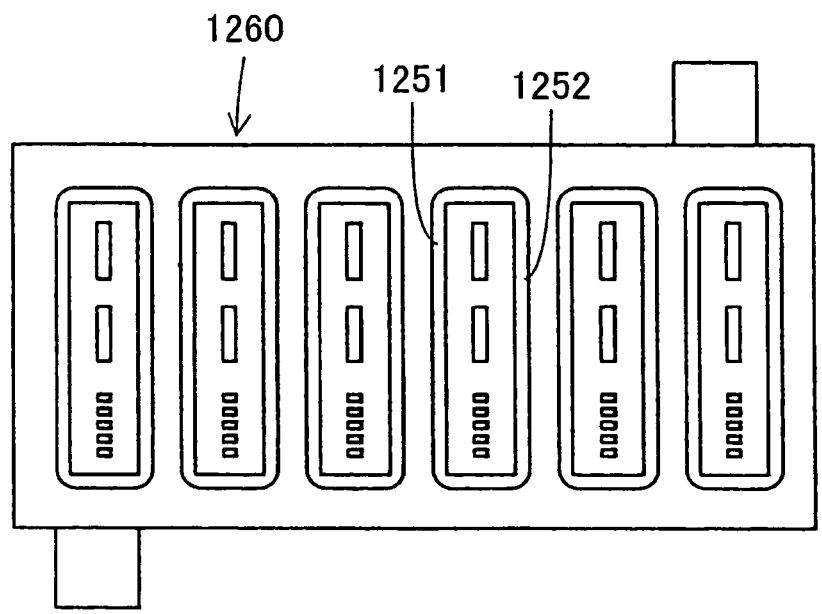
FIG. 22 is a (partial sectional) front view showing the mounting structure of a semiconductor device according to a seventh embodiment of the present invention.
Figure 23:
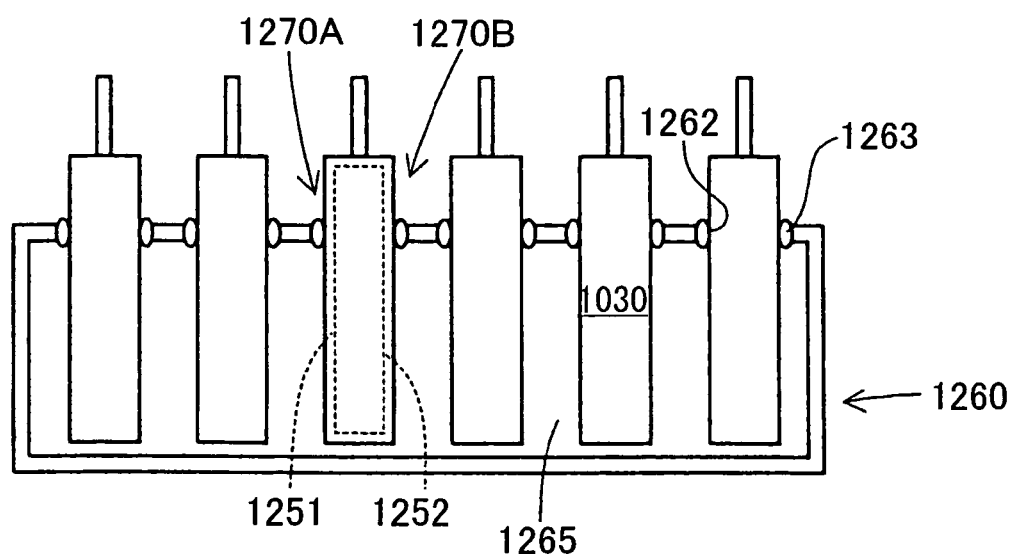
FIG. 23 is a plan view showing the mounting structure of the semiconductor device according to the seventh embodiment.
Figure 24:
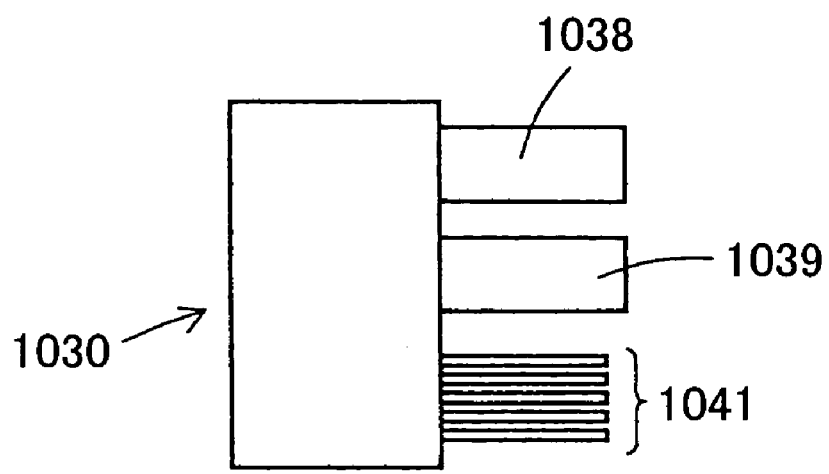
FIG. 24 is a front view showing a semiconductor module according to the seventh embodiment.
Figure 25:
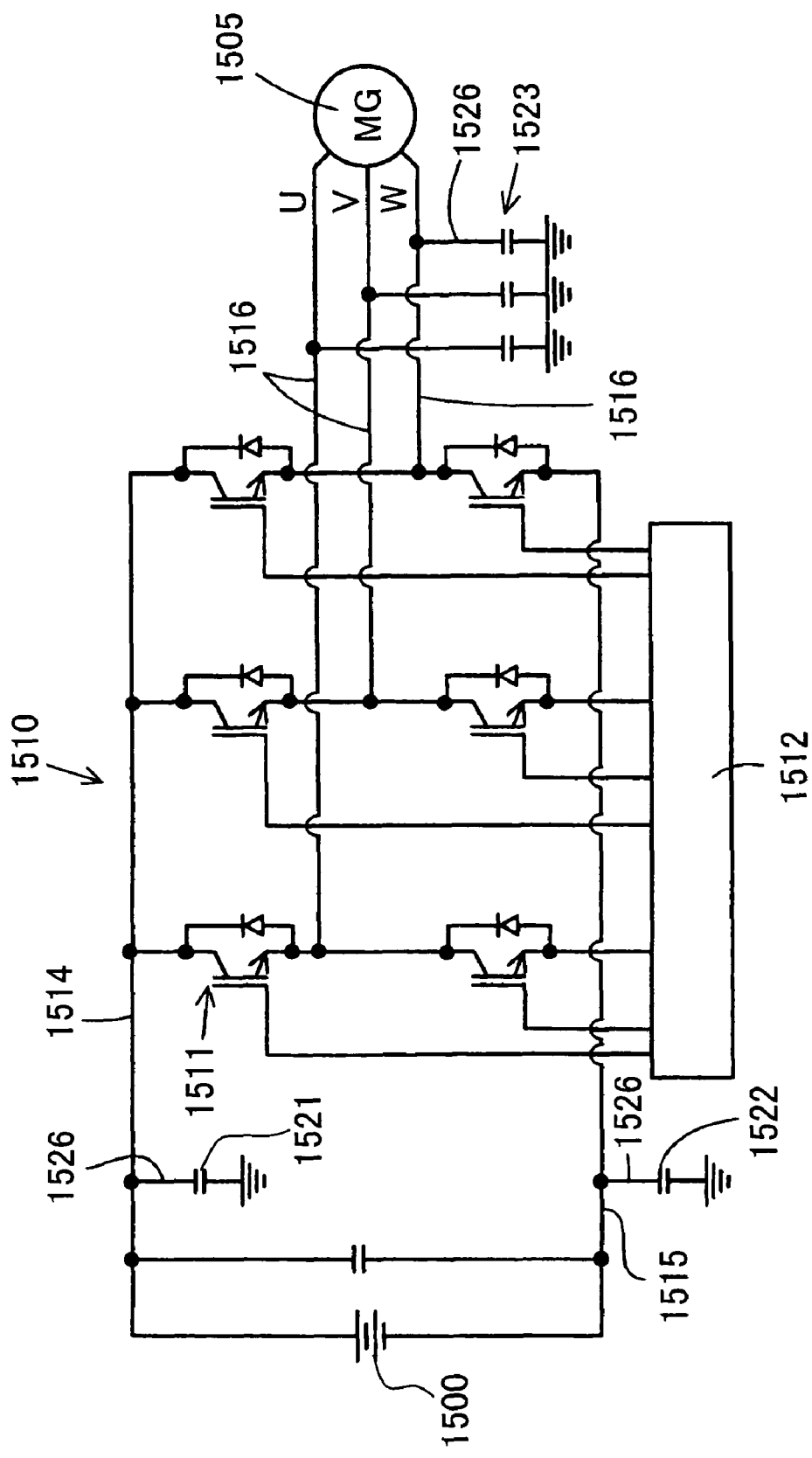
FIG. 25 is an explanatory view of a circuit in a first conventional example.
Figure 26:
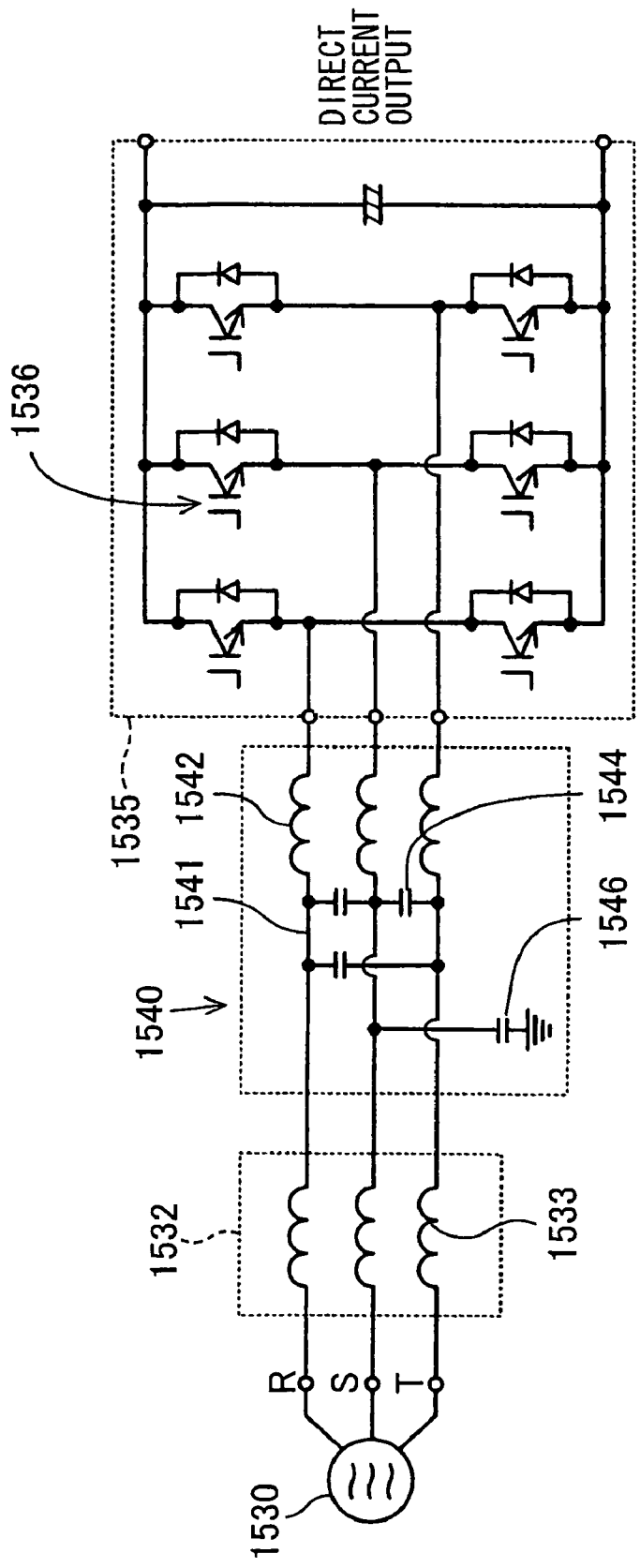
FIG. 26 is an explanatory view of a circuit in a second conventional example.

FIGS. 22 to 24 disclose a seventh embodiment. In the seventh embodiment, the first driving electrode terminal 1038, the second driving electrode terminal 1039 and the control terminal 1041 of the semiconductor module 1030 are projected from the same side face. The unillustrated front face of the first electrode plate 1035 and the unillustrated rear face of the second electrode plate 1036 are covered with first and second mold portions 1251, 1252.

Plural openings 1262 are arranged on the upper end side of a case 1260 that is manufactured by a metal, and an electrically conductive cooling medium 1265 is filled within these openings 1262. The lower end of each semiconductor module 1030 is dipped into the cooling medium 1265 in the case 1260, and the upper end is projected above from the opening 1262 and is sealed by a seal member 1263. First and second bypass capacitors 1270A and 1270B are formed by the first semiconductor element 1031 and the second semiconductor element 1032, the cooling medium 1265, and the mold portions 1251, 1252 located therebetween.

In accordance with the seventh embodiment, the bypass capacitors 1270A and 1270B are formed near the first semiconductor element 1031 and the second semiconductor element 1032 and also near every first and second semiconductor elements 1031 and 1032, and thereby noises generated by the semiconductor elements are effectively restrained. In addition, the case 1260 manufactured by a metal and storing the cooling medium 1265 positions the plural semiconductor modules 1030 in a predetermined state. Each semiconductor module 1030 can be positioned in the predetermined state only by inserting each semiconductor module 1030 from the opening 1262 of the case 1260, and thus the manufacturing time for the device is shortened.

What is claimed is:

1. A mounting structure of a semiconductor device, the structure comprising:
   a semiconductor module including a semiconductor element for supplying electricity, a first and a second electrode plates disposed on both sides of the semiconductor element, a connecting terminal connected to a control circuit for controlling the semiconductor element, and a resin mold having electric insulation for sealing the semiconductor element and the first and the second electrode plates; and
   a metallic casing accommodating cooling medium having electric conductivity, wherein a plurality of the semiconductor modules is proximally disposed in the cooling medium of the casing, wherein
   the first or second electrode plate, the cooling medium, a first or second mold portion of the resin mold provide a bypass capacitor for reducing noise.

2. The mounting structure of a semiconductor device according to claim 1, wherein the cooling medium is grounded.

* * * * *

UNITED STATES PATENT AND TRADEMARK OFFICE
CERTIFICATE OF CORRECTION

| | |
|---|---|
| PATENT NO. | : 8,027,161 B2 |
| APPLICATION NO. | : 12/457246 |
| DATED | : September 27, 2011 |
| INVENTOR(S) | : Hiroshi Ishiyama |

It is certified that error appears in the above-identified patent and that said Letters Patent is hereby corrected as shown below:

Change the Title (54) and Col. 1, lines 1-3, from "ELECTRONIC POWER CONVERTER AND MOUNTING STRUCTURE OF SEMICONDUCTOR DEVICE" to --ELECTRIC POWER CONVERTER AND MOUNTING STRUCTURE OF SEMICONDUCTOR DEVICE--.

Signed and Sealed this
Sixteenth Day of October, 2012

David J. Kappos
*Director of the United States Patent and Trademark Office*